(12) United States Patent
Hombs et al.

(10) Patent No.: US 8,599,903 B2
(45) Date of Patent: Dec. 3, 2013

(54) QR-RLS ADAPTIVE DIGITAL FILTER WITH 18-BIT PIPELINE ARCHITECTURE

(75) Inventors: Brandon P. Hombs, Merrimack, NH (US); John A. Tranquilli, Jr., Merrimack, NH (US); Joseph A. Farkas, Merrimack, NH (US); Leonard E. Russo, Nashua, NH (US); Joshua D Niedzwiecki, Manchester, NH (US)

(73) Assignee: Collision Communications, Inc., Portsmouth, NH (US)

( * ) Notice: Subject to any disclaimer, the term of this patent is extended or adjusted under 35 U.S.C. 154(b) by 529 days.

(21) Appl. No.: 12/869,875

(22) Filed: Aug. 27, 2010

(65) Prior Publication Data

US 2012/0051475 A1   Mar. 1, 2012

(51) Int. Cl.
*H04B 1/707* (2011.01)

(52) U.S. Cl.
USPC ........................................... 375/146

(58) Field of Classification Search
USPC ......... 370/208, 229, 311, 329, 332, 335, 342, 370/441, 210, 280; 375/130, 142, 146, 150, 375/232, 260, 267, 296, 343, 346, 348, 350, 375/140, 141, 143, 147, 149; 455/63.1, 73, 455/91, 121, 562.1, 506; 708/322; 714/755, 714/790
See application file for complete search history.

(56) References Cited

U.S. PATENT DOCUMENTS

| | | | |
|---|---|---|---|
| 6,385,232 B1 * | 5/2002 | Terashima | 375/149 |
| 6,954,485 B1 * | 10/2005 | Hashimoto et al. | 375/147 |
| 6,965,586 B1 * | 11/2005 | Maruyama | 370/335 |
| 7,245,673 B2 | 7/2007 | MacLeod | |
| 8,428,107 B1 * | 4/2013 | Best et al. | 375/147 |
| 2001/0030995 A1 * | 10/2001 | Gesret et al. | 375/150 |
| 2002/0070845 A1 | 6/2002 | Reisinger et al. | |
| 2006/0215611 A1 | 9/2006 | Nakagawa et al. | |
| 2008/0144733 A1 * | 6/2008 | ElGamal et al. | 375/267 |
| 2011/0051674 A1 | 3/2011 | Niedzwiecki et al. | |

FOREIGN PATENT DOCUMENTS

| | | |
|---|---|---|
| JP | 2000-252918 A | 9/2000 |
| WO | 00-71843 A2 | 11/2000 |

OTHER PUBLICATIONS

Kittty K.Y. Wong and Peter J. McLane: Low-Complexity Space-Time Turbo Equalizer with the Soft-Output M-Algorithm for Frequency Selective Channels—2005 IEEE. pp. 2251-2255.*
D. Stevens; S. Das; B Natarajan "A Multi-objective Algorithm for DS-CDMA Code Design Based on the Clonal Selection Principle" GECCO '05, Jun. 25-29, 2005, Washington DC, USA.*

(Continued)

*Primary Examiner* — Sam K Ahn
*Assistant Examiner* — Shawkat M Ali

(57) ABSTRACT

A QR-RLS adaptive digital filter provides fast computation without excessive computational resources. 18-bit multipliers enhance speed, and a floating point inverse square root block adjusts dynamic range in 12-dB steps. A memory stores two P-matrix copies, one being delivered with rows shifted according to the clock speed so as to enhance pipeline processing. Embodiments reliably detect modulation schemes, demodulate strong signals by passing feedback bits between multiple stages, remove impulses due to lightening, etc, erase symbol estimates which exceed an error threshold, and add high frequency noise to avoid mathematical divergence caused by excessive S/N. A genetic method is provided for identifying asynchronous spreading codes with minimum correlations, whereby randomly selected candidates compete based on Frobenius norms of their correlations, the weakest being discarded and the process being iterated. A method is provided for selecting optimal filter sampling windows for simultaneously detected symbol streams having relative timing delays.

5 Claims, 16 Drawing Sheets

(56) References Cited

OTHER PUBLICATIONS

JP Office Action dated Nov. 29, 2011 against JP Patent Application No. 2009-098246; translation by Meisei International Patent Firm.

EP Office Action dated Jan. 18, 2011 against (related) EP Patent Application No. 03817679.8; BAE Systems Information and Electronic Systems Integrations, Inc. (Applicant).

Baines, S.J. et al., "Double window multi-user detection for asynchronous DS-CDMA", IEEE 1996, Electronic Letters, Nov. 21, 1996, vol. 32, No. 24, pp. 2199-2201.

Damnjanovic, A. et al., "Iterative Multiuser Detection/Decoding for Turbo Coded CDMA Systems", IEEE Communications Letters, vol. 5, No. 3, Mar. 2001, pp. 104-106.

Wang, X. et al., "An Overlapping Window Decorrelating Multiuser Detector for DS-CDMA Radio Channels", IEEE Transactions on Communications, vol. 49, No. 8, Aug. 2001, pp. 1488-1495.

U.S. Non-Final Office Action mailed Jan. 17, 2013 for related U.S. Appl. No. 13/090,435, filed Apr. 20, 2011.

Ali H. Sayed, Fundamentals of Adaptive Filtering, Wiley—IEEE Press (Jun. 13, 2003), Hoboken, NJ, p. 784-789.

Simon Haykin, Adaptive Filter Theory, Prentice Hall; 3rd edition (Dec. 27, 1995), Upper Saddle River, NJ, p. 564-569.

* cited by examiner

| Row # | 1 | 2 | 3 | 4 | 5 | 6 | 7 | 8 |
|---|---|---|---|---|---|---|---|---|
| 1 | -0.55 | | | | | | | |
| 2 | 0.06 | -0.85 | | | | | | |
| 3 | -0.10 | 1.26 | -0.25 | | | | | |
| 4 | -0.83 | 0.67 | 0.66 | | | | | |
| 5 | 0.29 | -1.60 | -0.81 | -0.86 | | | | |
| 6 | -1.34 | -1.44 | 0.53 | 1.70 | -1.20 | | | |
| 7 | 0.72 | 0.57 | 0.22 | 0.59 | 1.10 | -0.12 | | |
| 8 | 1.63 | -0.40 | -0.92 | -0.64 | -1.88 | -0.26 | -0.07 | |

Col #

Figure 2A

| Row # | 1 | 2 | 3 | 4 | 5 | 6 | 7 | 8 |
|---|---|---|---|---|---|---|---|---|
| 1 | | | -0.55 | | | | | |
| 2 | | | 0.06 | -0.85 | | | | |
| 3 | | | -0.10 | 1.26 | -0.25 | | | |
| 4 | | -0.83 | | 0.67 | 0.66 | -0.86 | | |
| 5 | | 0.29 | -1.60 | 1.19 | -0.81 | 1.70 | -1.20 | -0.12 |
| 6 | | -1.34 | -1.44 | -1.20 | 0.53 | 0.59 | 1.10 | -0.07 |
| 7 | | 0.72 | 0.57 | -0.02 | 0.22 | -1.88 | -0.26 | |
| 8 | 1.63 | 0.69 | -0.40 | -0.92 | -0.64 | | | |

Col #

Figure 2B

| time approx [ns] | QR decomposition | | | | time approx [ns] | Update SSE |
|---|---|---|---|---|---|---|
| | | kgam( symbol 0 ) | | | 0 | |
| | D | G | Q | L | | |
| 0 | | | | | | |
| 20 | uPI(1) | | | | | |
| 40 | uPI(2) | G(1) | kgam(0) | | | |
| 76 | uPI(3) | G(2) | kgam(1) | new_PI(1) | | |
| 112 | uPI(4) | G(3) | kgam(2) | new_PI(2) | | |
| 132 | uPI(5) | G(4) | | ... | | |
| | uPI(6) | G(5) | | new_P(47) | | |
| 972 | | | | | | |
| 1920 | | kgam( symbol 1 ) | | | 1920 | sse(1:5)( symbol 0 ) |
| | D | G | Q | L | 2136 | Apply W |
| 1560 | uPI(1) | | | | 2196 | Demodulate (0:4) |
| 1580 | uPI(2) | G(1) | kgam(0) | | 2416 | PLL (0:4) |
| 1616 | uPI(3) | G(2) | kgam(1) | new_PI(1) | 2506 | Error_Calc(0:4) |
| 1652 | uPI(4) | G(3) | kgam(2) | new_PI(2) | 2698 | Update W |
| 1672 | uPI(5) | G(4) | | ... | | |
| | uPI(6) | G(5) | | new_P(47) | | |
| 2512 | | | | | | |
| 3840 | | kgam( symbol 2 ) | | | 3840 | sse(1:5)( symbol 1 ) |
| | D | G | Q | L | | |

Figure 3

QR-RLS ADAPTIVE DIGITAL FILTER WITH 18-BIT PIPELINE ARCHITECTURE

STATEMENT OF GOVERNMENT INTEREST

The invention was made with United States Government support under Contract No. W15P7T-06-C-P423 awarded by the United States Army. The United States Government has certain rights in this invention.

FIELD OF THE INVENTION

The invention relates to digital filters, and more particularly, to adaptive digital filters.

BACKGROUND OF THE INVENTION

Digital filters are applied to an ever widening range of technology fields. For some applications, adaptive filter coefficients are required, since at least some parameters of the desired processing operation are not known a priori, and/or change over the course of time. For example, wireless communication bandwidth-sharing technologies such as, Frequency Division Multiple Access (FDMA) and Code Division Multiple Access (CDMA) all typically require some sort of digital filtering so as to separate the signals that share a common bandwidth. In many circumstances, the timing synchronicity and/or frequencies of the individual signals are not precisely known, for example due to varying distances to sources and/or Doppler shifts due to moving sources. In these situations it is common to employ an adaptive filter, which uses feedback to refine the values of the filter coefficients, and thereby to optimize the response of the filter.

A variety of algorithms are available for implementation of digital filters. The Least Mean Squares algorithm requires only relatively simple mathematical operations, but has a slow convergence speed and sometimes suffers from so-called "eigenvalues spread." Compared to least mean squares (LMS) algorithms, recursive least squares (RLS) algorithms have faster convergence speeds and do not exhibit the eigenvalue spread problem. However, RLS algorithms involve more complicated mathematical operations, and require more computational resources than LMS algorithms.

Although digital filters which implement the standard RLS algorithm typically have a fast convergence speed, the standard RLS algorithm diverges when the inverse correlation matrix $P(n)$ loses the properties of positive definiteness and/or Hermitian symmetry. This diverging of the standard RLS algorithm therefore limits its application. However, the QR decomposition-based RLS (QR-RLS) algorithm can resolve this instability. Instead of requiring the computation of the inverse correlation matrix of the input signal, the QR-RLS algorithm works directly with the incoming data matrix through QR decomposition. Therefore, this algorithm guarantees the property of positive definiteness, and is more numerically stable than the standard RLS algorithm.

In some applications of digital filtering, it is necessary to successfully detect and filter weak signals in the presence of one or more very strong signals. One approach is to initially only detect and separate the strong signals, and then to computationally remove the strong signals from the total signal before attempting to isolate and distinguish the weaker signals. However, this approach can introduce significant delay ("latency") to the process, which can be unacceptable in some real-time applications.

One of the applications to which QR-RLS filters are often applied is to wireless communication. In wireless communication, a variety of modulation schemes can be employed so as to increase the data transmission rate. Among these are BPSK (Binary Phase Shift Keying), QPSK (Quadrature Phase Shift Keying), 4-QAM (4-level Quadrature Amplitude Modulation), and 16-QAM. The optimum modulation scheme depends at least partly upon the signal-to-noise (S/N) of the detected signal. Signals with a high S/N can be modulated using one of the high throughput modulation schemes such as QPSK or 16-QAM. However, signals with lower S/N will experience fewer errors and better overall transmission rates using one of the lower throughput modulation schemes, such as BPSK.

Under circumstances wherein a variety of nodes communicate at different signal strengths, it is desirable to support more than one modulation scheme simultaneously. Typically, communication protocols which support simultaneous use of more than one modulation scheme specify that each packet will include near the beginning of the packet a few modulation identification bits which are transmitted using a default modulation scheme (such as BPSK or QPSK), while the remainder of the packet is transmitted using the specified method (e.g. 16-QAM).

While this can be an efficient approach for maximizing bandwidth usage, errors in reading any of the modulation identification bits can lead to unnecessary packet loss due to inability to read the remainder of the packet, and even to uncertainty as to whether a packet was in fact transmitted.

Another challenge in the application of QR-RLS filters to the communication of wireless signals is the introduction of "impulses" into the signals due to lightening strikes, welding arcs, and other unpredictable EMF noise bursts. Since QR-RLS filters are adaptive, occasional strong signal impulses can cause a filter to "adapt" away from its optimal settings. And the effects of such impulses on QR-RLS performance can be long lasting, since QR-RLS filters typically include a significant number of prior input points when calculating adaptive parameters.

Yet another challenge which arises when wireless signals are asynchronously communicated using the CDMA frequency spreading protocol is that the asynchronous frequency "spreading codes" must be as uncorrelated as possible. Yet it can be very difficult to find asynchronous spreading codes which are substantially uncorrelated for all possible timing offsets.

Still another challenge in wired and wireless communication is the fact that overlapping symbols from various transmitting nodes arrive at the receiver with different timing offsets. Although estimates of the timing offsets are typically known, it can nevertheless be very difficult to select an optimal windowing function which will provide as much signal as possible from each overlapping symbol with a minimum of contribution from neighboring symbols.

Very strong signals with very high S/N can also be a challenge for a QR-RLS filter, since a lack of significant noise can cause divergence of some of the mathematical manipulations included in the QR-RLS algorithm.

A need therefore exists for a QR-RLS adaptive filter which provides fast computation time without requiring excessive computational resources, removes the effects of strong signals so as to enable more reliable detection of weak signals, and avoids divergence of mathematical manipulations due to excessively high S/N. Methods are also needed for reliably detecting modulation schemes without unnecessary loss of packets, removing impulses due to lightening, welding arcs, and other sources so as to avoid adaptation of the filter to these false inputs, finding asynchronous spreading codes with minimum correlations at all timing offsets, and for selecting optimal sampling windows when simultaneously detected symbols include timing offsets due to distance effects and/or other causes.

SUMMARY OF THE INVENTION

One general aspect of the present invention is a QR-RLS adaptive filter which provides fast computation times without requiring excessive computational resources. Embodiments of the QR-RLS filter reliably detect modulation schemes without unnecessary loss of packets, remove the effects of strong signals so as to enable more reliable detection of weak signals, remove impulses due to lightening, welding arcs, and other sources so as to avoid adaptation of the filter to these false signals, and avoid divergence of mathematical manipulations due to excessively high S/N. Methods are also provided for identifying asynchronous spreading codes with minimum correlations at all timing offsets and for selecting optimal sampling windows when simultaneously detected symbol streams include timing offsets due to distance effects and other causes.

The filter of the present invention is an N-tap QR-RLS implementation which combines efficient use of 18-bit multipliers with a pipeline architecture so as to provide high speed filtering without requiring excessive computational resources. Eighteen-bit multipliers such as the DSP48S, which is provided on the Xilinx FPGA (Field Programmable Gate Array), inherently perform the required 18-bit multiplications used in most stages of the filter, while the "G-machine," which calculates adaptive matrix rotation and manipulation parameters including an inverse square root function, includes a custom floating-point block which changes the scale of the inverse square root based on the input signal level, thereby extending the dynamic range of this function. This allows the QR-RLS filter of the present invention to perform well on signals that fully span the dynamic range of possible input signals. In some embodiments, the scale of the inverse square root is changed in 12 dB steps.

An optimal ordering of the delivery to the "D-Machine" inner-product module of "P-matrix" information stored within a "P-RAM" memory enables pipelining which further reduces processing time. Two copies of the P-matrix are stored within the P-RAM modules, one of which supplies the P-matrix to the "D-machine," which forms the dot-product between the P-matrix and the input signal, and the other of which supplies the P-matrix to the Q-machine, which applies the matrix rotations and manipulations calculated by the G-machine.

Embodiments of the invention are scalable in the number of taps and the number of users. The number of taps, N, can be increased to support longer multi-path delay spreads or to support longer symbol durations at a given sampling rate. A "W-machine" performs the operations that calculate the filters for each user, so user support can be increased simply by adding another filter chain in the W-machine.

Embodiments of the present invention are adapted for demodulation of strong user signals. In these embodiments, a separate P-matrix and a complete set of calculation stages (including, in various embodiments, a D-machine, a G-machine, a Q-machine, an L-machine, and a W-machine) is included for each stage of demodulation. The first stage includes a P-matrix of dimensions N×N, and filters in the W-machine of length N, where N is the number of taps. The output of the first stage is a set of $Y_1$ symbol estimates, where $Y_1$ is the number of strong signals to be demodulated. The second stage then includes a P-matrix with dimensions $(N+Y_1) \times (N+Y_1)$ and filters of length $(N+Y_1)$ in the W-machine, where the P-matrix is recursively computed from an input of $[u(n) f_b]$, where $u(n)$ is the signal input, and $f_b$ is the set of $Y_1$ output symbol estimated from the previous stage. This process can be continued if there are more than two distinct levels of signal strength, whereby the next stage includes a P-matrix of dimensions $(N+Y_1+Y_2) \times (N+Y_1+Y_2)$, and so forth.

Some embodiments of the present invention include a method for preventing the QR-RLS filter from adapting to large symbol errors by erasing symbol estimates for which the estimate exceeds all possible symbol results by more than a specified amount.

In other embodiments, phase rotations of the input signal are tracked over time by a "phase-locked loop" (PLL) and the phase rotation is then applied to the to the decision feedback portion of the QR-RLS filter. This allows the weight vector to track the amplitude and relative phases of the optimal filter taps while a PLL tracks the complex rotation of the filter. This is accomplished in the filter by applying the PLL rotation to the "desired output" variable inside of the filter.

In certain embodiments, small amounts of high pass noise are added to the input signal so as to avoid divergence of the QR-RLS mathematical manipulations due to excessively high S/N. The high pass noise is added to make sure the condition number of the correlation matrix is not too high for the dynamic range of computing platform. In the case of a communication signal, which is typically oversampled, the added noise has very little effect on the signal of interest, because the signal is contained in the lower frequencies, while the noise is contained in the upper frequencies. This technique enables the QR-RLS filter to operate at various levels of SNR without the need for computationally expensive techniques to track the bit growth of the inverse correlation matrix.

Another general aspect of the present invention is a method for reliably detecting a modulation scheme used in a packet, and for reliably determining whether a packet was sent or not. In this method, a communications protocol specifies a plurality of available modulation schemes. When a packet is transmitted, a sequence of modulation scheme auto-sensing bits is included near the beginning of the packet. The auto-sensing bits are transmitted using a "default" modulation protocol. The auto-sensing bits encode a modulation scheme value selected from either the range –X to –X/Y or the range X/Y to X, where X specifies the total range of possible values, and Y is used to reserve a central region of values with +/–X which are not assigned to any modulation schemes. Apparent detection of a modulation value within the central region therefore indicates that no packet was sent.

The auto-sensing bits include a most-significant bit which indicates whether the positive or negative range is being used, followed by a series of bits which are summed to determine the modulation scheme value. The detector provies "soft" outputs, so that a plurality of "weight bits" correspond to each auto-sensing bit. According to the most significant bit (MSB), the weight bits are added to or subtracted from an accumulator, and the result is compared to a series of decision statistic thresholds so as to determine which modulation scheme was used. The remainder of the packet is then interpreted according to the determined modulation scheme. In various embodiments, the decision statistic thresholds are equally spaced, while in other embodiments the decision statistic thresholds are spaced so as to increase the probability of detection of some modulation schemes over others.

Still another general aspect of the present invention is a method for removing impulse signals from the input of an adaptive digital filter, so as to avoid unwanted "adaptation" of the filter to the impulse. The method includes making a signal "mean square estimate" (MSE), wherein sufficient signal is included in the estimate to ensure that any impulse present therein will have a negligible effect. An impulse MSE is then calculated about each signal point, wherein each MSE estimate includes at most only the number of samples expected to be included in an impulse. The impulse MSE's are then divided by the signal MSE, and those data points are identified as impulses for which the ratio exceeds a specified threshold. The impulses are then removed by any of several methods according to the embodiment.

Yet another general aspect of the present invention is a method for identifying minimum correlation spreading codes for use in signal spreading methods such as CDMA asynchronous communication. The method applies a genetic algorithm whereby each member of an initial population of candidate codes is subjected to a fitness evaluation, a selection process, and a reproduction process so as to generate a next generation of codes.

The fitness evaluation includes choosing small sub-populations, which in some embodiments include three sets of codes, taking the absolute values of the correlation squared across all shifts of all pairs of codes in the sub-population and building an $N_{chips} \times N_{codes} \times N_{codes}$ matrix of the correlations, where $N_{codes}$ is the number of codes in the sub-population and $N_{chips}$ is the number of "chips" or code steps per communication symbol. The maximum across all the shifts is then taken to form an $N_{codes} \times N_{codes}$ matrix, and the Frobenius norm of the $N_{codes} \times N_{codes}$ matrix is taken, where a lower the Frobenius norm indicates a better group of spreading codes.

The selection process in embodiments is a tournament scheme. In a tournament, three individuals are randomly chosen to "compete," and the individual with the worst fitness, ie the highest Frobenius norm, is removed.

Still another general aspect of the present invention is a method for selecting a windowing function which will include as much energy as possible from each overlapping symbol while minimizing the amount of energy which is included from neighboring symbols when signals from a plurality of sources are collected simultaneously, and when the symbols in the signals are not fully synchronous, due for example to differences in transmission path length and oscillator inaccuracies in transmitting sources. The method assumes that estimates are available for the timing offsets of each information stream. The method proceeds as follows:
1. Sort the timing delays (TDs) in order of lowest to highest
2. Adjust all users' TD's so that they are greater than the maximum TD
   a. All adjustments are done in terms of samples per symbol (32 samples in some embodiments)
3. Re-sort the adjusted TDs in order of lowest to highest
4. Determine the best time offset to use for the window
   a. For each user subtract their adjusted TD from the maximum sorted adjusted TD
   b. Set the new maximum TD to the current adjusted TD plus one symbol worth of samples
   c. If the difference is less than the prior difference,
      i. Subtract off two symbols worth of samples from the adjusted TD and save that number as the time offset
      ii. Set this difference as the new minimum difference "MD" for future comparisons
      iii. For first user use a difference of one symbol in samples (32 in some embodiments)
   d. If the difference is equal to or greater than the threshold move to the next user
   e. Repeat previous steps until through all valid users
5. Set the PN to be the training index for each user
   a. Subtract the original TD from the time offset and round down (i.e., floor( )) to a symbol boundary
6. Add two symbols to the above answer to get the PN training index One general aspect of the present invention is a QR-RLS adaptive digital filter having N taps. The QR-RLS adaptive digital filter includes a D-machine which is capable of calculating the product of a PL-matrix and an input stream using 18-bit integer multipliers, the PL-matrix being a square matrix of dimensions N×N. The filter further includes a G-machine which is capable of calculating the inverse square root of a gain factor gamma, the G-machine including a floating point block which changes the scale of the inverse square root based on an input signal level so as to adjust the dynamic range of the inverse square root calculation. The filter also includes a Q-machine which is capable of applying matrix rotations and manipulations calculated by the G-machine to PL-matrix data using 18-bit integer multipliers. In addition, the filter includes a W-machine which is capable of calculating filter taps and applying a digital filter to the input data stream using 18-bit integer multipliers according to parameters supplied by the Q-machine. The filter includes an L-machine which is capable of calculating a forgetting factor lambda and applying it to parameters supplied by the Q-machine so as to calculate an adapted PL-matrix. And the filter includes a P-memory capable of storing a D-copy of the PL-matrix and a Q-copy of the PL-matrix, the Q-copy being supplied to the Q-machine in sequential rows and columns without column offsets, the D-copy being supplied to the D-machine in sequential rows and columns with column offsets, the column offsets being determined according to the relative clocking speeds of the P-memory and the D-machine so as to optimize pipeline processing efficiency of the QR-RLS filter.

In various embodiments, at least some of the 18-bit calculations are performed by DSP48S eighteen-bit multipliers. In some of these embodiments the DSP48S multipliers are provided on a Xilinx FPGA field programmable gate array.

In certain embodiments, the G-machine is capable of adjusting the dynamic range of the inverse square root calculation in steps of 12 dB. I In various embodiments the PL-matrix consists of a plurality of complex elements, each of the complex elements consisting of an 18-bit real part and an 18-bit imaginary part. And in some of these embodiment the number of taps N is scalable.

In some embodiments the filter is capable of separating overlapping signals from a plurality of users up to a maximum number of users, and the maximum number of users can be increased by adding an additional filter chain to the W-machine, without modifying any components of the filter not included in the W-machine.

Other embodiments further include at least one additional stage, each additional stage including a D-machine, a G-machine, a Q-machine, an L-machine, a W-machine, and a P-memory, each additional stage being configured to combine symbol estimates from at least one previous stage with the input stream so as to demodulate at least one relatively stronger signal estimated by a preceding stage from the input stream.

In certain embodiments the filter is capable of erasing symbol estimates having complex values which fall outside of a specified region of allowable symbol element complex values. And various embodiments further include a phase locked loop (PLL) which is capable of tracking variations in phase of the input data stream, and the filter is capable of applying the tracked phase variations to a feedback portion of the filter.

In some embodiments calculating the adapted PL-matrix includes comparison of estimated in-packet training symbols with known hard values of the in-packet training symbols, the in-packet training symbols being distributed in groups throughout packets, the filter being capable of adapting filter parameters according to a combination of a plurality of groups of training symbols, the groups of training symbols being combined using the lambda forgetting factor, and/or adapting filter parameters based on individual groups of training symbols, without combination with other groups of training symbols.

Another general aspect of the present invention is a method for reducing divergence of QR-RLS mathematical manipulations due to excessively high signal sensitivity. The method includes adding high pass noise to a data input stream, the high pass noise being configured so as to have substantially no frequency overlap with signals of interest.

Yet another general aspect of the present invention is a method for communicating information enabling a receiver to reliably determine if a packet has been received, and enabling the receiver to reliably identify a modulation scheme used to encode a received packet.

The method includes assigning to each packet a group of X modulation bits located near the beginning of the packet. The method further includes assigning to each of a plurality of available modulation schemes a modulation value, each modulation value being in one of two ranges, the two ranges being $-X$ to $-X/Y$ and $+X/Y$ to $+X$, where Y is a number selected so as to create a desired gap between the two ranges.

The method also includes encoding by a transmitter into the modulation bits the modulation value for a selected available modulation scheme using a standard modulation scheme, a remainder of the packet being encoded by the transmitter using the selected available modulation scheme, the modulation value being represented as a sum of modulation bits such that each of the summed modulation bits has equal significance.

The method further includes detecting of the packet by the receiver, each of the X modulation bits being detected by b weight bits, so that the two ranges are represented by two ranges of detected modulation values, the two ranges of detected modulation values being the ranges $-2^{b-1}$Nr to $-(2^{b-1}$ Nr$)/Y$ and $(2^{b-1}$ Nr$)/Y$ to $2^{b-1}$ Nr, where r is the value of a fully confident bit estimate, the modulation values being surrounded by non-overlapping regions of values which are bounded by threshold values.

The method also includes summing of the detected modulation bits so as to determine a decision statistic, comparing the decision statistic with the threshold values, and if the decision statistic falls within a region corresponding to an available modulation scheme, determining that the modulation scheme of the packet is the corresponding modulation scheme, otherwise, determining that a valid packet has not been received.

In some embodiments, the non-overlapping regions surrounding the modulation values are all of equal size. In other embodiments, the non-overlapping regions surrounding the modulation values are of unequal sizes, thereby providing correspondingly unequal probabilities of detection of the corresponding modulation values.

Still another general aspect of the present invention is a method for removing an impulse signal from an input stream of a digital filter. The method includes obtaining a baseline sample set from the input stream and calculating a baseline mean square estimate (B-MSE) thereof, the baseline sample set including sufficient samples to ensure that the B-MSE will not be significantly affected if an impulse is contained therein. The method further includes dividing the baseline sample set into a plurality of candidate impulse sets, and for each of the candidate impulse sets, calculating an impulse mean square estimate (I-MSE) thereof, and declaring that the candidate impulse set includes an impulse if the ratio I-MSE/B-MSE exceeds an impulse threshold value X. The method also includes if the candidate impulse set includes an impulse, removing the impulse from the data stream.

In various embodiments removing the impulse from the data stream includes replacing the impulse with zero values, replacing the impulse with values selected from regions of the data stream adjacent to the impulse, replacing the impulse with zero values and then filtering the signal, replacing the impulse with values obtained by averaging adjacent signal values, and/or subtracting out the impulse if the impulse structure is known.

In some embodiments removing the impulse from the data stream includes detecting the peak of the impulse and replacing the values of a plurality of samples surrounding the peak.

Yet another general aspect of the present invention is a genetic method for identifying groups of asynchronous spreading codes having minimal mutual correlations. The method includes randomly selecting a population of candidate spreading codes, grouping the candidate spreading codes into competition groups, within each competition group, ranking the spreading codes according to their fitness relative to the other members of the competition group, for each competition group, eliminating at least the candidate spreading code having the lowest fitness, replacing the eliminated candidate spreading codes with randomly selected replacement spreading codes, and repeating the steps of grouping, ranking, eliminating, and replacing until a termination criterion has been met.

In various embodiments, ranking the spreading codes within each competition group includes for each candidate spreading code in the competition group, calculating its correlations with all other members of the competition group for each 1-chip relative time shift therebetween, calculating the Frobenious norm of each calculated correlation, determining the maximum Frobenious norm for each candidate spreading code in the competition group, and ranking each candidate spreading code in the competition group according to its maximum Frobenious norm, the candidate with the highest maximum Frobenious norm having the lowest fitness of the competition group.

Still another general aspect of the present invention is a method for determining a sampling window appropriate for an input signal supplied to a QR-RLS filter, the input signal including a plurality of streams of overlapping symbols arising from a plurality of users, the symbols having relative timing delays TD(i), the timing delays TD(i) being at least approximately known. The method includes sorting the input streams according to their timing delays from lowest to highest and determining the largest timing delay, also referred to herein as the maximum timing delay TDmax, increasing the timing delays of all of the input streams in units of one symbol so that all of the timing delays are greater than TDmax, and re-sorting the input streams according to their adjusted timing delays from lowest to highest.

The method further includes assigning to each user an integer index i, setting a minimum delay MD variable and a time offset TO to initial values of one symbol length each, and iterating for each user i the steps of:

subtracting TD(i) from TDmax to determine an offset O(i); increasing TD(i) by one symbol length; and if O(i) is less than MD, resetting MD equal to O(i) and setting the time offset TO to TD(i).

The method also includes defining the beginning of the sampling window as the value of TO resulting from the step of iterating.

In some embodiments the length of the sampling window is equal to the number of taps N of the QR-RLS filter. And other embodiments further include assigning an index PN(i) to each user i, each PN(i) being calculated by subtracting the original TD(i) for user i from TO, rounding down to a symbol boundary, and adding two symbol lengths.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2A is a table which illustrates an exemplary PL-matrix for an embodiment where N is equal to 8;

FIG. 2B is a table illustrating re-ordering of the matrix elements of FIG. 2A for optimum pipelining in the D-machine inner product stage of the filter;

FIG. 3 is a table which illustrates pipelining of the QR-RLS filter in an embodiment of the invention;

DETAILED DESCRIPTION

Figure 1:
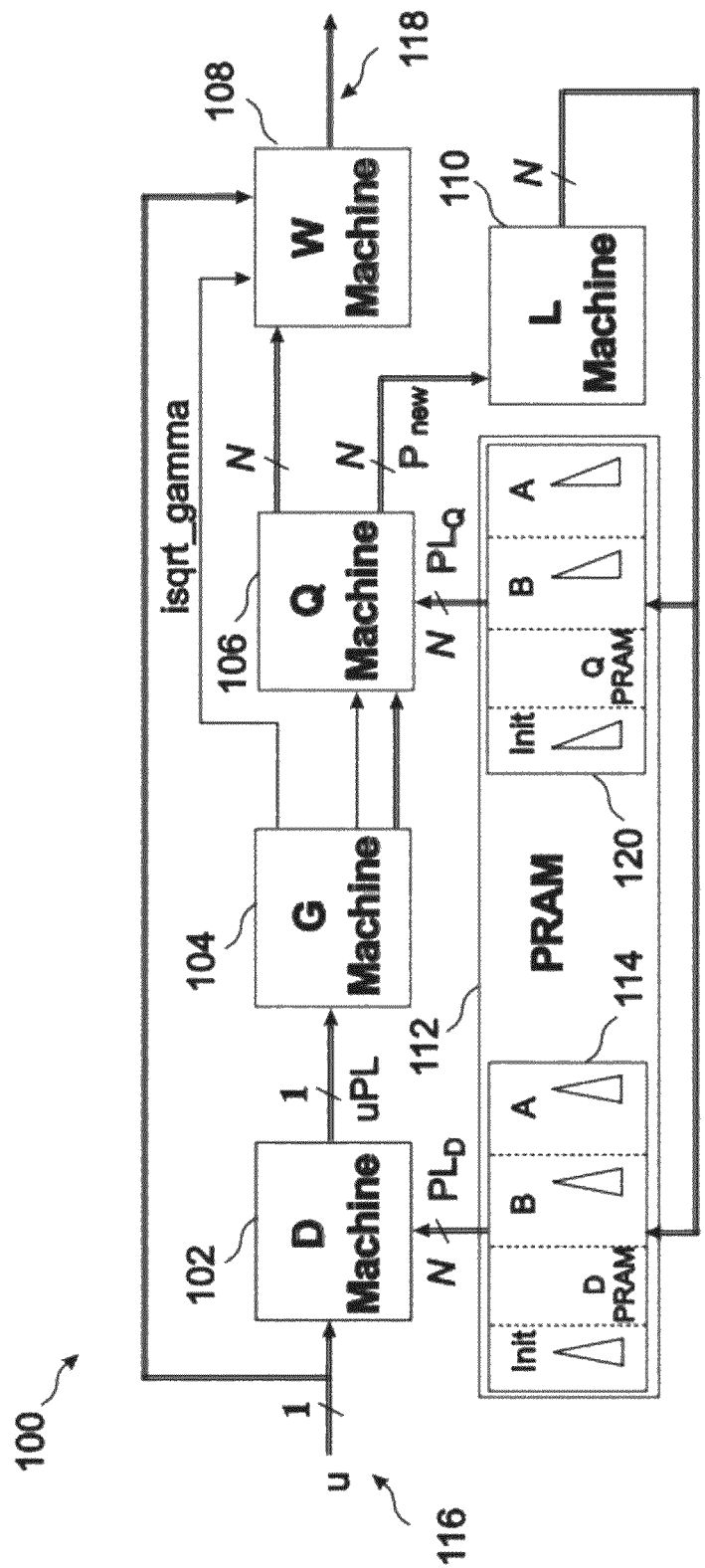
FIG. 1 is a block diagram illustrating the basic components of the QR-RLS filter of the present invention.

With reference to FIG. 1, the present invention is an N-tap QR-RLS implementation 100 which combines efficient use of 18-bit multipliers with a pipeline architecture so as to provide high speed filtering without requiring excessive computational resources. The filter is organized into a group of "machines" designated as the "D" machine 102, the "G" machine 104, the "Q" machine 106, the "W" machine 108, and the "L" machine 110. Two copies of the λ-weighted N×N P-matrix (PL) are maintained in a PRAM 110, where λ is the so-called "forgetting factor." The D-PRAM copy 114 is supplied to D-machine 102, which performs the inner product between the input signal u 116 and the PL-matrix.

The G-machine receives the uPL output of the D-machine and calculates the "Givens" rotors, which are then applied to the signal by the by the Q-machine. The G-machine also calculates the inverse square root of the conversion factor γ, which is used by the W-machine to calculate the weighting functions and "taps" of the filter. The taps are then applied to u by the W-machine so as to provide the filter output 118, typically in the form of soft symbol estimates. The Q-machine also calculates a new P-matrix, to which the forgetting factor λ is applied by the L-machine 110.

In some embodiments, eighteen-bit multipliers such as the DSP48S, which is provided on the Xilinx FPGA (Field Programmable Gate Array), inherently perform the required 18-bit multiplications used in most stages of the filter 102, 106, 108, 110, while the "G-machine 104," which calculates adaptive matrix rotation and manipulation parameters including an inverse square root function, includes a custom floating-point block that changes the scale of the inverse square root based on the input signal level, thereby extending the dynamic range of this function. This allows the QR-RLS filter 100 of the present invention to perform well on signals that fully span the dynamic range of possible input signals. In some embodiments, the scale of the inverse square root is changed in 12 dB steps.

With reference to FIGS. 2A and 2B, an optimal ordering of the delivery to the "D-Machine" 102 of PL-matrix information stored in the D-PRAM section 114 of the "P-RAM" memory 112 enables pipelining in the D-machine 102, which further reduces processing time. In some embodiments, the copies of the PL-matrix are organized as rows of complex 18-bit entries, so that the word length is N×18×2, where N is the number of complex entries and the factor of 2 is because each entry includes an 18-bit "real" part and an 18-bit "imaginary" part. In some of these embodiments the memory is organized as N BRAMs, where each BRAM is configured as 36 bits by 512 bits. In the Q-PRAM 120, the BRAMs are clocked in unison, so that the elements of the PL-matrix are presented to the Q-machine 106 in order. This is illustrated in FIG. 2A for an example in which N=8.

In some of these embodiments, the BRAMs in the D-PRAM 114 are clocked with different offsets, so as to present the elements of the PL-matrix to the D-machine 102 in an order which is optimized for pipelining. In some embodiments, an element from the PL-matrix is delivered to the D-machine 102 every k clock cycles, and the data from the rows is offset according to the formula column offset=−1*floor((r+k−1)/k), where r is the row number, and elements are only delivered when the column number is greater than or equal to zero. This is illustrated in FIG. 2B for the PL-matrix of FIG. 2A in an example where k=4. The resulting pipelining schedule for this embodiment for a 200 MHz clock speed is illustrated in FIG. 3.

Embodiments of the invention are scalable in the number of taps and the number of users. The number of taps, N, can be increased to support longer multi-path delay spreads or to support longer symbol durations at a given sampling rate. The "W-machine" 108 performs the operations that calculate the filters for each user, so user support can be increased simply by adding another filter chain in the W-machine 108.

Feedback Bits

Embodiments of the present invention are extended for increased performance by including feedback from demodulation of strong user's bits in other users' processing. These embodiments require X PL-matrices, where X is the number of stages of demodulation desired. A stage of demodulation encompasses a complete set of the D-machine 102, G-machine 104, Q-machine 106, W-machine 108, and L-machine 110, along with an associated PL-matrix for each stage. The size of the first PL-matrix is be N×N, where the length of the filters in the W-machine is N, as defined above.

Figure 4:
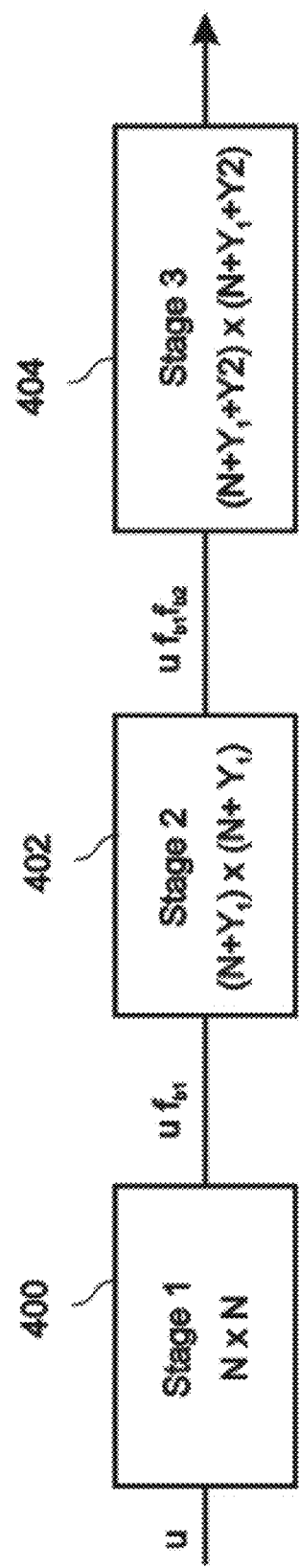
FIG. 4 is a block diagram illustrating the use of feedback bits and a plurality of filtering stages to distinguish strong signals from overlapping weak signals.

As is illustrated in FIG. 4, the output of the first stage 400, which is a complete QR-RLS process, is $Y_1$ hard symbol estimates, where $Y_1$ is the number of strong users demodulated in the first stage. These hard symbol estimates are fed into the next stage QR-RLS 402, which will have a N+$Y_1$× N+$Y_1$ PL-matrix, where the matrix is recursively computed from an input of [u(n)f$_b$] (where f$_b$ is the $Y_1$ output soft symbol estimates from the previous stage) and N+$Y_1$ length filters in the W-machine. This stage 402 will benefit from the covariance matrix adapting to the estimated (with high confidence) hard symbols from the loud users. This process can be repeated through multiple stages if desired, with the next stage 404 taking the $Y_2$ hard symbol outputs of the second stage QR-RLS 402 (along with the $Y_1$ from the first stage) to create a N+$Y_1$+$Y_2$×N+$Y_1$+$Y_2$ P-matrix and N+Y $Y_2$ W-machines. In general, as many stages, X, can be implemented as desired with the constraint that the sum of all the $Y_1$ does not exceed the total number of users to be demodulated. In some circumstances the gains decrease with increasing number of stages, and the computational complexity increased rapidly with the number of stages. Hence, in some embodiments only two-stages of demodulation are implemented.

In-Packet Training

Embodiments of the present invention include "in-packet" training, whereby known bits or symbols are interspersed between segments of unknown bits or symbols. In order to support higher levels of mobility, an RLS algorithm needs be able to adapt to changing conditions quickly. The primary way of handling this is the forgetting factor, 2, which controls how much the filter relies on old data when adapting its terms. As shown in equation 1 below, the forgetting factor λ is a multiplicative term, less than 1, that makes each iteration rely less and less on data that occurs further in the past. However, because it is exponential, it never completely forgets. For example, even after 2000 iterations, the estimate of the covariance matrix still has a contribution of 0.00054 times the very first covariance estimate. This effect is important when considering In-Packet Training (IPT).

$$E[r(t)r^H(t)] \approx \Sigma_{n=0}^{t} \lambda^{t-n} r(n) r^H(n) \qquad (1)$$

Figure 5A:
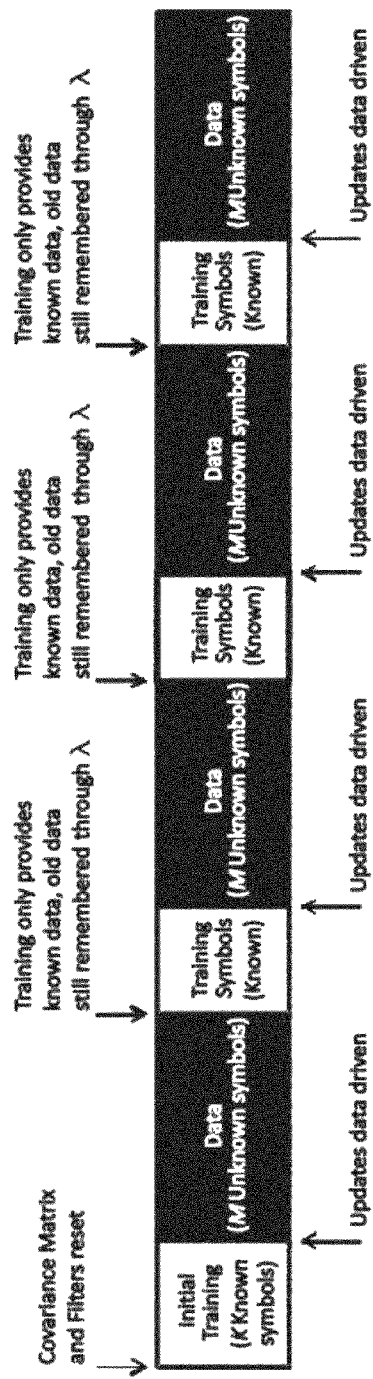
FIG. 5A illustrates a packet with distributed in-packet training bits in an embodiment where previous data is remembered due to the "lambda" forgetting factor.
Figure 5B:
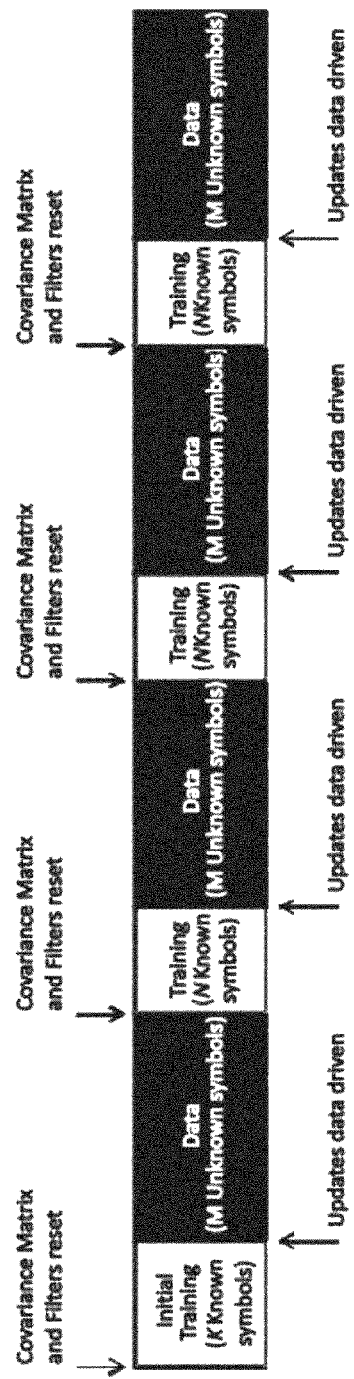
FIG. 5B illustrates a packet with distributed in-packet training bits in an embodiment where the covariance matrix and filters are reset for each set of training bits.

Because the filter of the present invention is adaptive to its data, its performance depends on whether or not it correctly decodes each symbol. Every incorrectly decoded symbol will drive the filter away from an improved estimate. Hence, embodiments of the present invention increase the number of known symbols as compared to typical prior art filters, and distribute them within the packet (as opposed to having them all be at the beginning). This enables the filter to adapt more efficiently as the input data changes. Embodiments insert groups of training symbols (of length N) every M symbols throughout the packet. As illustrated in FIG. 5A, In some of these embodiments the filter remembers its previous data and uses the training bits to ensure that it is continuing to adapt to new data correctly. As illustrated in FIG. 5B, in other embodiments the filter essentially starts over, forgetting all the past estimates and retraining from zero.

Erasures

Some embodiments of the present invention include a method for preventing the QR-RLS filter from adapting to large symbol errors by erasing symbol estimates for which the estimate exceeds all possible symbol results by more than a specified amount.

Figure 6:
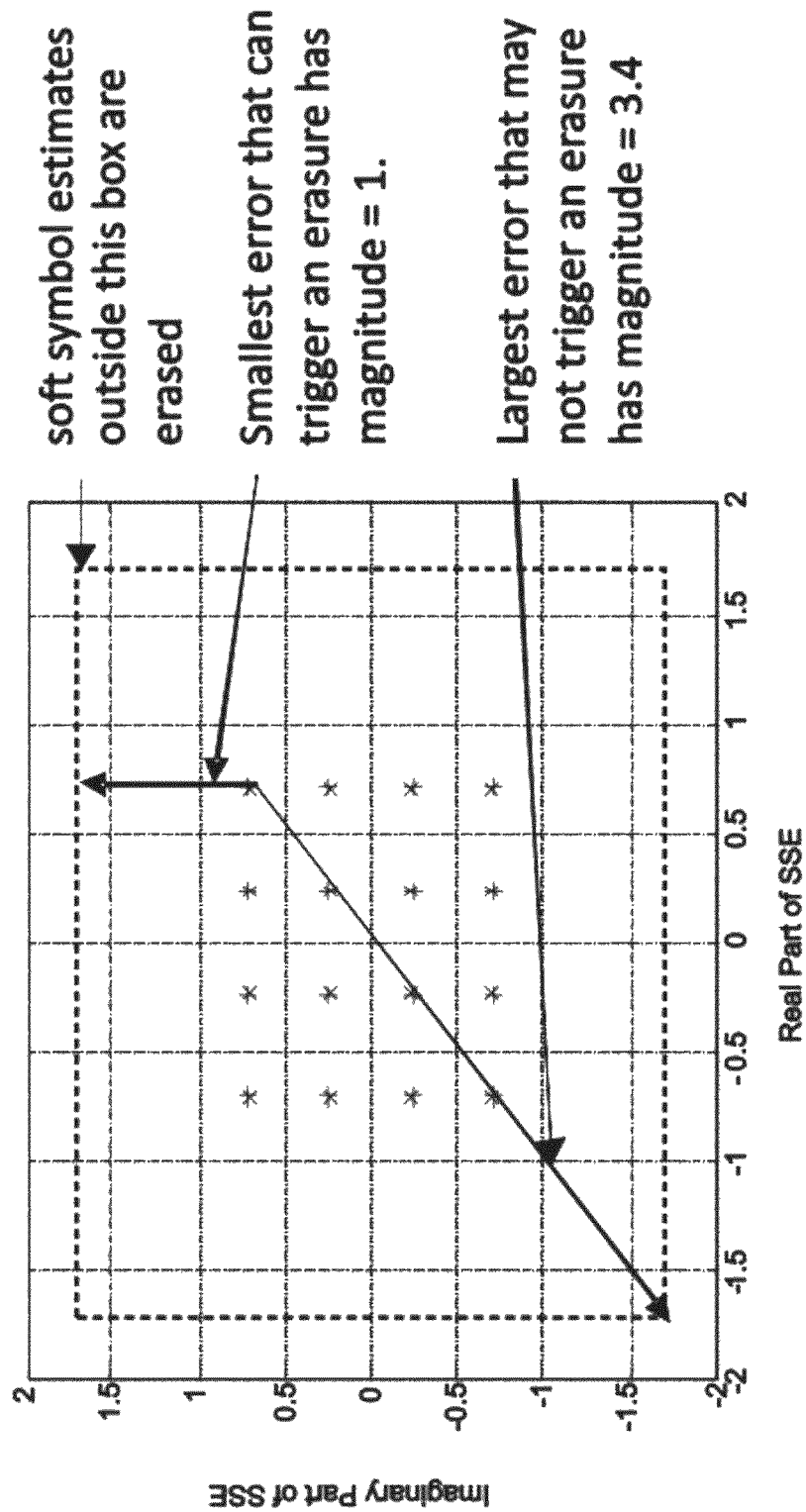
FIG. 6 is a graphical illustration of a set of symbols, indicating boundaries and maximum errors outside of which soft symbol estimates are erased.

A problem occurs when the error is very large, because the amount of adaptation is proportional to the error size. Infrequently, impulses or other noise bursts can be included in the input stream which is fed to the QR-RLS filter. These bursts could result in large errors which the filter might still use to adapt and demodulate. For this reason, certain embodiments remove large errors that do not exhibit the stationary nature required by the filter. The erasure functionality of these embodiments prevents the filter from adapting to, or creating a soft decision output for any symbol that has an error component (real or imaginary) greater than a specified value between the soft symbol estimate and the hard symbol decision. Clearly, because this error depends on the determined hard symbol estimate, it is possible for errors between the true symbol and the soft symbol to have up to a magnitude of 3.4 time the specified error. However, this method can also protect from errors as small as the specified value. This is graphically depicted in FIG. 6 for an embodiment in which the "hard symbols" have an amplitude of 0.707 (inverse of the square root of 2), and the specified error value is 1.

PLL Phase Tracking

In addition to the filter convergence problems caused by large non-stationary noise in the data, the carrier offset or Doppler shift of the received signal relative to the receiver's local oscillator causes the angle of the symbol estimates to drift over time. This can be compensated for by allowing the RLS to track the phase rotation, however, this will lead to higher mean square error in the optimal weight vector because the optimal solution is valid for only a short time.

In various embodiments, phase rotations of the input signal are tracked separately over time by a "phase-locked loop" (PLL) and the phase rotation is then applied to the to the decision feedback portion of the QR-RLS filter. This allows the weight vector to track the amplitude and relative phases of the optimal filter taps while a PLL tracks the complex rotation of the filter. This is accomplished in the filter by applying the PLL rotation to the "desired output" variable inside of the filter. Similar techniques are not required for tracking the inverse covariance matrix, because the phase rotation is negated when a vector is multiplied by its Hermitian transpose.

Subspace Dithering for Numerical Stability

Embodiments of the present invention include a data whitening step which includes multiplying data by the square root of the inverse correlation matrix. A problem can occur in numerical evaluation of the inverse correlation matrix when the condition number of the matrix is very large. Embodiments of the invention mitigating this numerical instability by adding noise to the subspace spanned by the least dominate eigenvalues.

Figure 7:
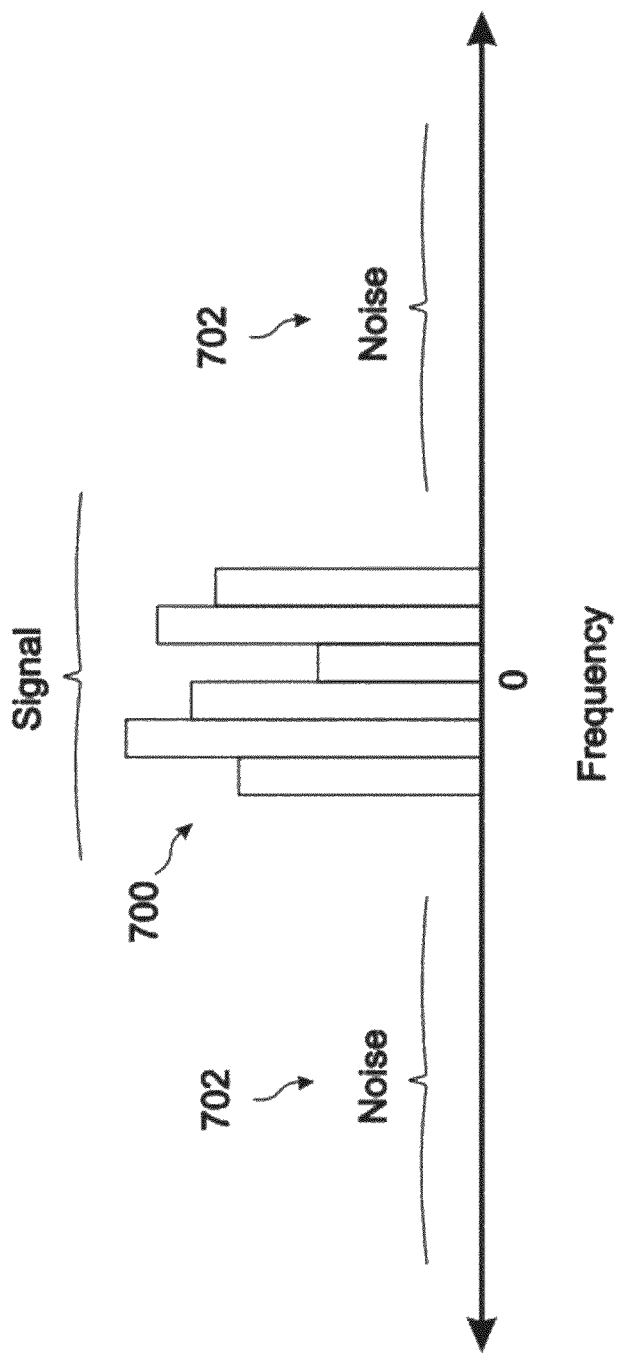
FIG. 7 is a frequency graph indicating the addition of artificial noise to frequency ranges which do not overlap with the oversampled signal, so as to avoid divergence of calculations due to excessively high signal sensitivity.

For large data windows the eigenvectors of the correlation matrix approach complex exponentials (this is because the correlation matrix is Toeplitz, which is closely approximated by a cyclic matrix for large data records). Embodiments exploit this fact by tracking and adding noise to the weaker subspace. For example, when a signal is sampled in a communication receiver it is often sampled faster than the Nyquist rate ("oversampled"). As illustrated in FIG. 7, the result is that the higher (absolute) frequencies contain very little information about the signal 700. If the S/N of the desired signal is very high, then the higher frequencies will appear to have no energy in them (due to quantization effects in the radio). This in turn can create singularities in the correlation matrix which is unacceptable for data whitening.

To mitigate this effect, embodiments of the invention add small amounts of high pass noise 702 to the signal to make sure the condition number of the correlation matrix is not too high for the dynamic range of computing platform. In the case of a communication signal, this will have very little effect on the signal of interest 700 because it is contained in the lower (absolute) frequencies. This technique enables the algorithm to operate at various levels of S/N without the need for computationally expensive techniques to track the bit growth of the inverse correlation matrix.

Modulation Auto-Sensing

When a system has support for more than one modulation scheme, such as BPSK (Binary Phase Shift Keying), QPSK (Quadrature Phase Shift Keying), 4-QAM (4-level Quadrature Amplitude Modulation), or 16-QAM, there needs to be a way for the receiver to know which modulation a given packet uses, preferable without having to be explicitly told beforehand by the system. Accordingly, embodiments of the present invention include a modulation scheme auto-sensing detector. The detector determines for an expected transmission, first if a packet was sent or not, and then what type of modulation the packet uses if one was detected.

In this method, the communications protocol specifies a plurality of available modulation schemes. When a packet is transmitted, a sequence of modulation scheme auto-sensing bits is included near the beginning of the packet. The auto-sensing bits are transmitted using a "default" modulation protocol. The auto-sensing bits encode a modulation scheme value selected from either the range $-X$ to $-X/Y$ or the range $X/Y$ to $X$, where X specifies the total range of possible values, and Y is used to reserve a central region of values with $+/-X$ which are not assigned to any modulation schemes. Apparent detection of a modulation value within the central region therefore indicates that no packet was sent.

The soft bit estimates derived from the soft symbol estimates out of the QR-RLS filter include a most-significant bit which indicates whether the positive or negative range is being used, followed by a series of weight bits which are summed to determine the confidence of the bit estimate. The range of possible detected values therefore spans the range of $\pm 2^b Xr$, with one value at zero, and the rest spaced in two ranges: $-2^{b-1}Xr$ to $-2^{b-1}Xr/Y$ and $2^{b-1}Xr/Y$ to $2^{b-1}Xr$, where b is the number of weight bits per auto-sensing soft bit estimate, X is the number of bits used in the auto-sensing sequence, Y defines how big of a range is set aside for detecting non-existing packets, and r is the magnitude of a fully confident bit estimate.

According to the most significant bit (MSB), the weight bits are added to or subtracted from a running accumulator, and the resulting "decision statistic" is compared to a series of decision statistic thresholds so as to determine which modulation scheme was used. The decision statistic thresholds are distributed throughout the range such that each available modulation scheme has an assigned value with a non-overlapping range around it wherein if the decision statistic (described later) lands in this range, the associated modulation scheme (or a "no packet" declaration) is selected. The remainder of the packet is then interpreted according to the determined modulation scheme. In various embodiments, the decision statistic thresholds are equally spaced, while in other embodiments the decision statistic thresholds are spaced so as to increase the probability of detection of some modulation schemes over others.

Figure 8A:
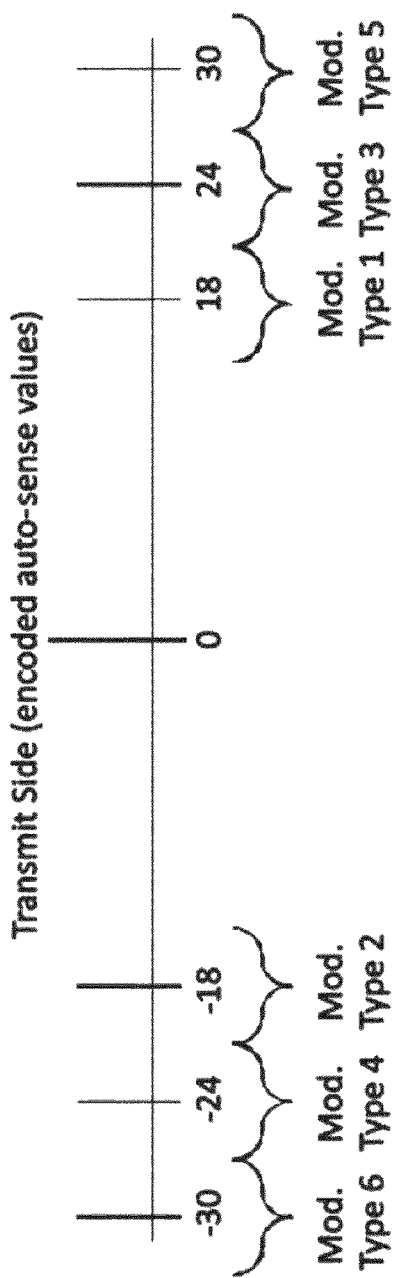
FIG. 8A is a diagram which illustrates encoding on the transmit side of modulation scheme values in modulation bits of a packet.
Figure 8B:
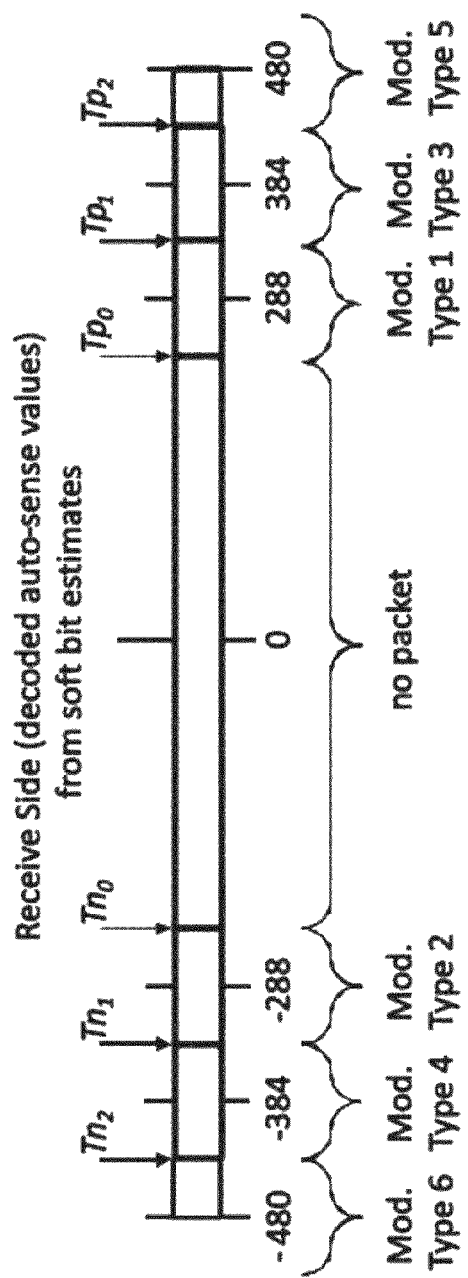
FIG. 8B is a diagram which illustrates decoding of the modulation bits of FIG. 8A on the receive side.

An embodiment is illustrated in FIGS. 8A and 8B wherein six available modulation schemes are encoded. On the transmit side, a sequence of 30 modulation bits having values of $+/-1$ are encoded with a value of $Y=5/3$, thereby providing encoded values which span the range of $-X$ to $-X/Y$ and X to $X/Y$, i.e. from $-30$ to $-18$ and from 18 to 30. These ranges are divided equally among the available schemes, so that the "hard" values are $-30$, $-24$, $-18$, 18, 24, and 30. On the receive side, 60 modulation bits are sampled with four weight bits per sample, giving each modulation bit a value of $-16$ to 16. The value of $Y=5/3$ provides a possible range of results of $-480$ to $-288$ and 288 to 480. The decision statistic thresholds $Tn_i$ and $Tp_i$ are equally spaced within these ranges, so as to provide equal probability of detecting each of the available modulation schemes.

Impulse Removal

Still another general aspect of the present invention is a method for removing impulse signals from the input of an adaptive digital filter, so as to avoid unwanted "adaptation" of the filter to the impulse. Here "impulse signal" is meant to refer to an unwanted signal which is much shorter in duration than the signals of interest. Because of the short duration of the unwanted signal, it will be referred to here as impulsive noise, but an impulse may contain more than a single sample.

Impulsive interference or noise can come from many sources, such as lightning, welding, DVD/CD/record scratches, etc. Images are also subject to impulsive noise from faulty pixels in camera sensors and faulty memory.

In all types of systems, the presence of unwanted impulsive noise will degrade performance. For a communication system, the BER will increase and there is a potential to "miss" the synchronization sequence. In radar systems, the probability of detection decreases and the probability of false alarm increases. In images, the image quality is reduced and image processing algorithms have trouble interpreting the high frequency impulsive signal. The removal on the impulsive noise is therefore very important.

The impulse removal algorithm of the present invention models the received signal as a Gaussian random variable, where $H_0$ indicates no impulse is present, $H_1$ indicates an impulse is present and P is the amplitude of the impulse.

Figure 9:
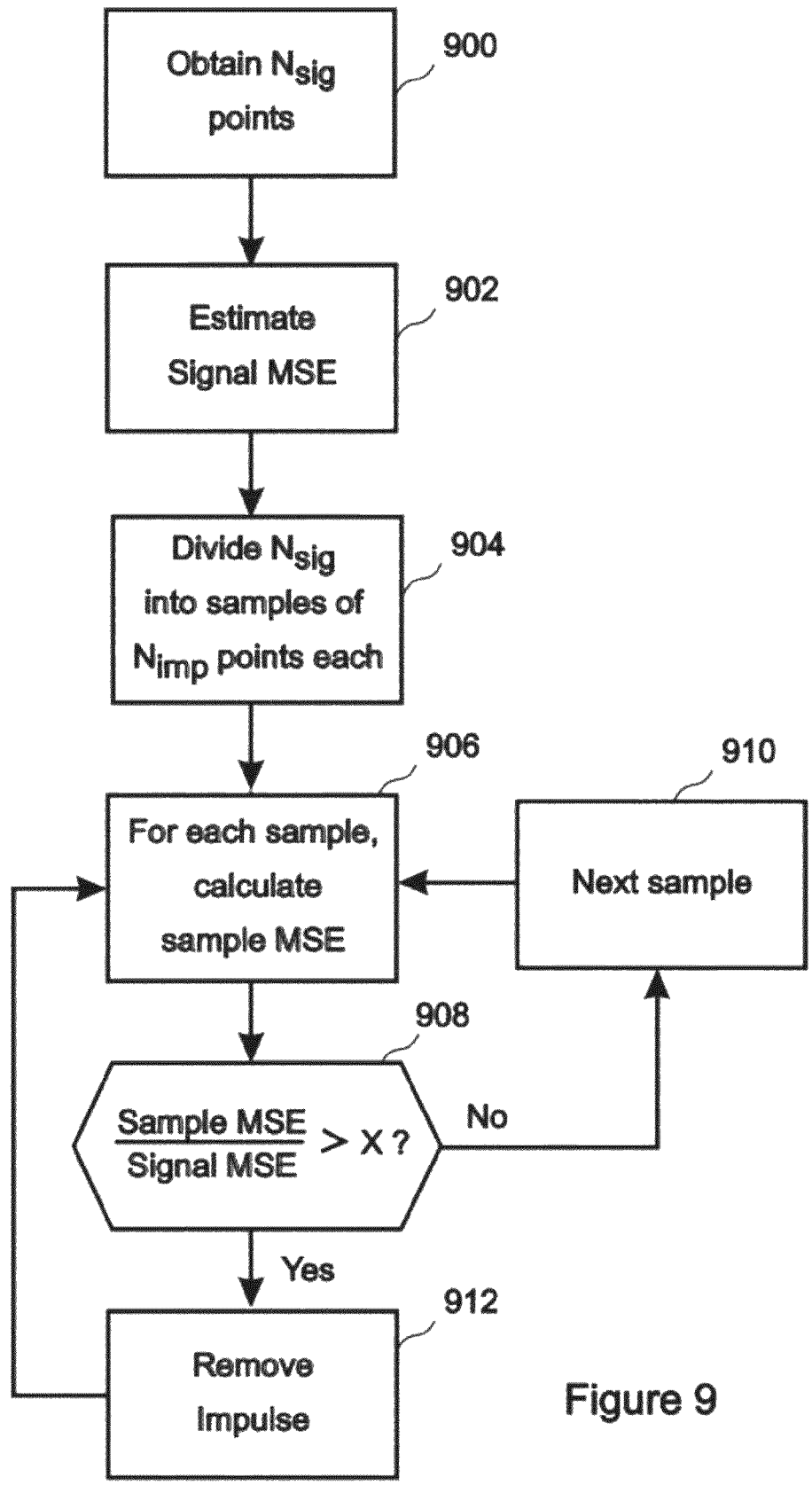
FIG. 9 is a flow diagram which illustrates the steps of removing impulses in embodiments of the present invention.

$H_0$: No impulsive noise: $X \sim N(0, \sigma^2)$
$H_1$: Impulsive Present: $X \sim N(P, \sigma^2)$ With reference to FIG. 9, the impulse removal algorithm is:
1. Obtain $N_{sig}$ points 900 within a sampling window, and make a mean square estimate (MSE) ($\hat{\sigma}_{sig}^2$) 902 to attempt to estimate the signal MSE. The sampling window must include enough samples ($N_{sig}$) so that any impulses within the sampling window do not significantly effective the $\hat{\sigma}_{sig}^2$ calculation.
2. Divide the sampling window into samples of $N_{imp}$ each 904, and make a MSE ($\hat{\sigma}_{imp}^2$) around each sample ($N_{imp}$) 906 to attempt to measure the MSE of a potential impulse. $N_{imp}$ should be the expected number of samples in the impulse or less.
3. Compare the MSE of the potential impulse with the MSE of the signal against a threshold X 908. If $\hat{\sigma}_{imp}^2/\hat{\sigma}_{sig}^2$ exceeds the threshold X, declare the sample as an impulse. Otherwise, continue with the next sample 910. X is a design parameter and is dependent on the desired aggressiveness of the impulse removal algorithm.
4. Remove the impulse and potential surrounding samples ($N_{rm}$) 912. In various embodiments, removing the impulse 912 includes:
   replacing the impulse with 0's or hold or other value;
   replacing the impulse with 0's and then filtering the signal;
   averaging the surround samples or pixels; and/or
   subtracting out the impulse if the impulse structure is repeatable.

Often times the impulsive noise is not truly one sample. This can occur because the "impulse" is actually a very short duration signal, or because the front-end bandwidth of the system is finite, causing an impulse to get stretched out into many samples. In these cases, it is typically desirable to detect the peak of the impulse and then subtract at multiple samples around the peak.

The four configurable parameters discussed allow for a flexible impulse removal algorithm. They are:
$N_{sig}$—Number of samples in the MSE of the signal;
$N_{imp}$—Number of samples in the MSE of the impulse;
X—Threshold to declare an impulse; and
$N_{rm}$—Number of samples to remove when an impulse is detected.

Minimum Correlation Spreading Codes

Embodiments of the present invention include a method for identifying minimum correlation spreading codes for use in signal spreading methods such as CDMA asynchronous communication.

In any system with spreading codes, a receiver's probability of a bit error will increase as the spreading codes become more correlated. For synchronous CDMA, the optimal spreading codes are well defined by Walsh codes and Hadamard Codes. However, for asynchronous CDMA, limited work has been done to determine codes to minimize the correlation.

Embodiments of the present invention use a genetic algorithm to minimize the correlations among a group of spreading codes, thereby reducing the computational requirements for finding spreading codes with minimal correlations as compared to the vast computational resources required to perform an exhaustive search. The genetic algorithms of the present invention are modeled after evolutionary biology. The basic steps of the genetic algorithm include the following:
1. Initialization—Randomly pick an initial population
2. Repetition
   a. Fitness—Evaluate the strength of every individual in the population
   b. Selection—Select best ranking individuals to reproduce, terminate weak individuals
   c. Reproduction—Breed a new generation randomly or using characteristics of the strongest population
3. Termination—Terminate the weakest population The key parameters in the genetic algorithm are:
$N_{chips}$—Number of chips per symbol;
$N_{codes}$—Number of spreading codes in a group; and
$N_{groups}$—Number of groups to run in the genetic algorithm.

During the initialization step, $N_{groups}$ groups of $N_{codes}$ binary spreading codes, having length $N_{chips}$ are generated, where $N_{codes}$ is the number of codes in the sub-population and $N_{chips}$ is the number of "chips" or code steps per communication symbol. The maximum across all the shifts is then taken to form an $N_{codes} \times N_{codes}$ matrix, and the Frobenius norm of the $N_{codes} \times N_{codes}$ matrix is taken, where a lower the Frobenius norm indicates a better group of spreading codes. The binary spreading codes may be complex. Each group of spreading codes represents a set of codes that could be assigned to specific radios or dictated by a scheduler to specific radios.

Choosing the fitness is the most crucial step in the process. If a fitness is not chosen that accurately reflects the strength of a spreading code candidate, searching for a spreading code candidate with a good fitness is useless. A fitness function used in embodiments of the present invention which nicely balances computational complexity with performance is computed with the following steps:
   Take the absolute value of the correlation squared across all shifts of two users;
   Build an $N_{chips} \times N_{codes} \times N_{codes}$ matrix of the correlations;
   Take the maximum across all the shifts to form a $N_{codes} \times N_{codes}$ matrix; and
   Take the Frobenius norm of the $N_{codes} \times N_{codes}$ matrix, where the lower the Frobenius norm indicates a better group of spreading codes.

Figure 10:
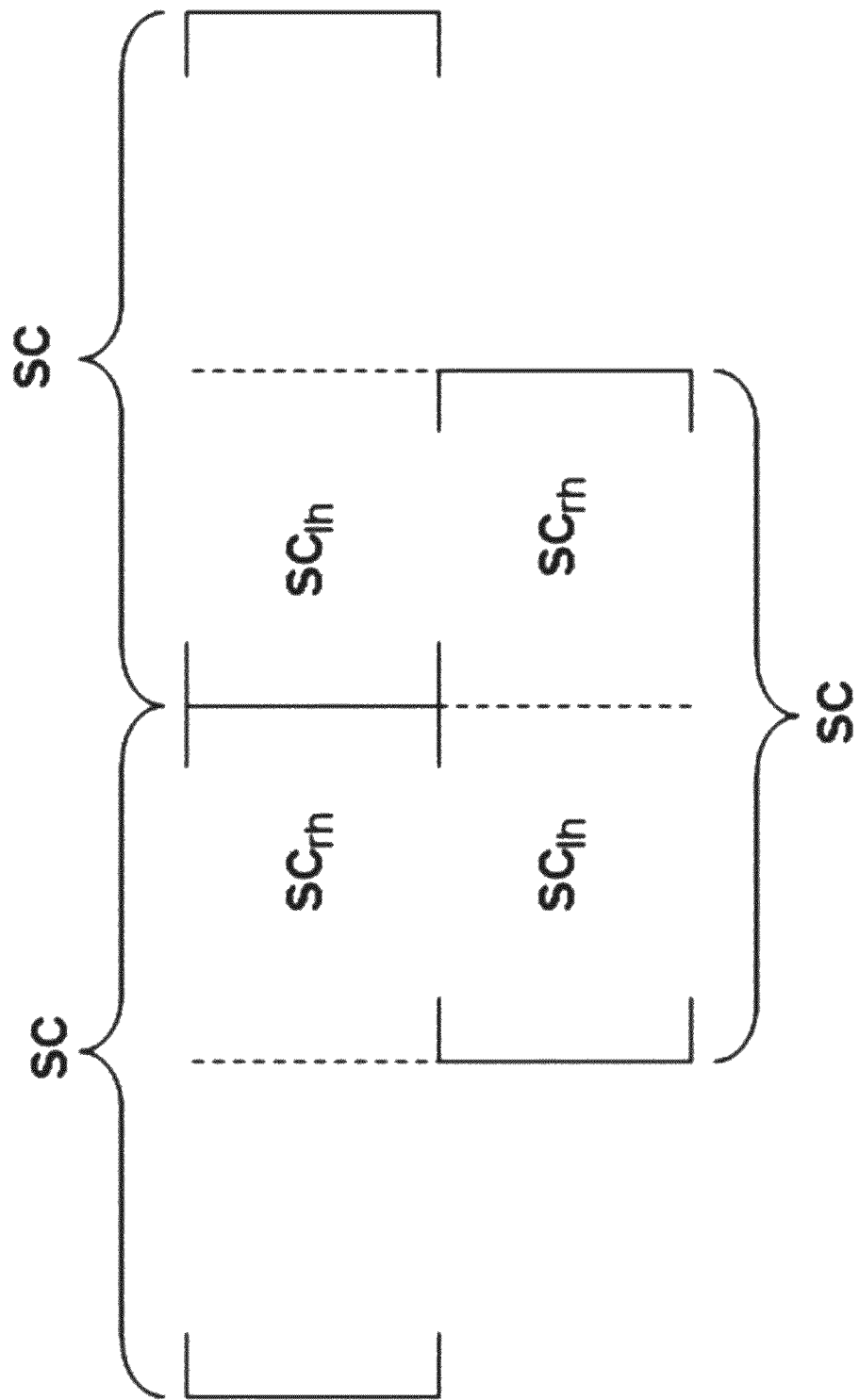
FIG. 10 is a diagram which illustrates overlapping spreading codes and the terms used to describe the math behind the tournament selection process in a genetic algorithm for selecting nearly uncorrelated spreading functions in an embodiment of the invention.

With reference to FIG. 10, in embodiments of the invention, the spreading code correlations are calculated according to the formula:

$$sc_{corr}(t) = |sc_{lh}^H sc_{rh}|^2 + |sc_{rh}^H sc_{lh}|^2 \qquad (2)$$

This calculation is repeated for each 1-chip time shift, and the maximum $SC_{corr}$ is determined. The Frobenious Norm of the maximum $SC_{corr}$ is then calculated.

The selection process is a tournament scheme. According to embodiments of the invention, a group of 100 candidates is selected. In a tournament, 3 candidates are randomly chosen from the group to "compete," and the candidate with the worst fitness, i.e. the highest Frobenius norm, is removed. This process is continued until all but one candidate has competed in a tournament. The 67 remaining candidates are then selected. The reproduction process then generates 33 new sets of codes, and the selection/reproduction process continues until the termination criteria is met. The termination criteria in various embodiments is to loop 100 times. After the process is terminated, the code set with the best fitness is the "winner."

When searching for spreading codes to minimize correlations, special attention has to be paid to avoiding converging on a single good solution which may not be the best solution. To avoid this problem the reproduction technique in embodiments of the invention uses completely new random codes each time, instead of taking characteristics of codes which have low cross correlations.

Windowing Algorithms

For applications wherein a plurality of "users" are being detected in an input stream and filtered by the QR-RLS filter, for example in an ad hoc CDMA system, it is often convenient to divide the input stream into processing windows. During each processing interval (or symbol) of the QR-RLS filter the data must be positioned so that the symbols to be detected for all users fall in the processing window. When the symbols in the signals are not fully synchronous, due for example to differences in transmission path length and oscillator inaccuracies in transmitting sources, it is important to select a windowing function which will include as much energy as possible from each overlapping symbol, while minimizing the amount of energy which is included from neighboring symbols.

Figure 11A:
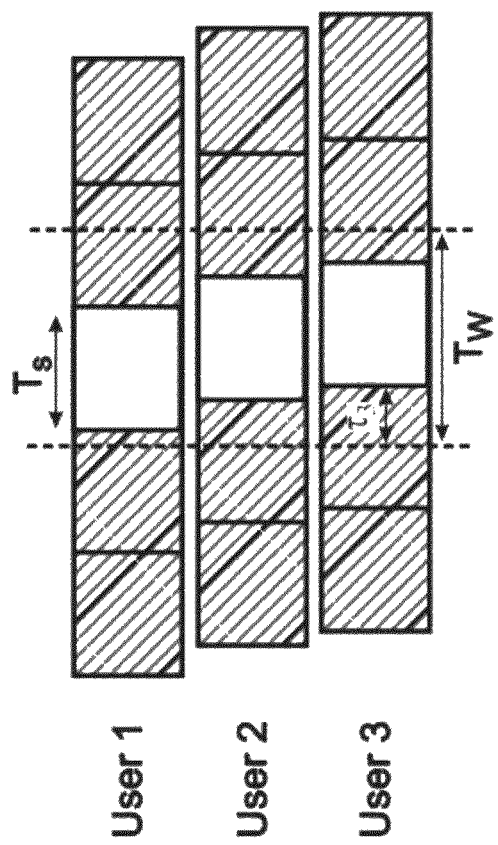
FIG. 11A is a diagram illustrating a possible window sampling function applied to an input stream containing signals from three overlapping users.
Figure 11B:
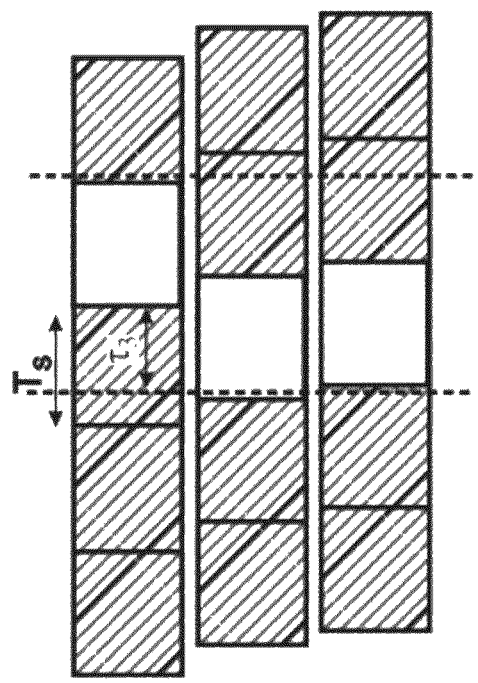
FIG. 11B is a diagram illustrating an alternative to the window sampling function of FIG. 11A.

An example of the necessity for a good choice of data windowing is shown in FIGS. 11A and 11B. Each block represents a different symbol interval, $T_s$, for each user. They are offset in time because of the propagation delays and other factors. The receiver can only process a small fixed processing interval or "window," $T_w$, due to complexity constraints. In FIG. 11A, one option is shown that tries to center in the window all of the symbols that are to be detected (shown with cross-hatching). In contrast, FIG. 11B shows another option for windowing which simply starts the window based on the beginning of user 2's symbol period. This windowing option may be worse than the option of FIG. 11A, because there may be energy from user 1's symbol that extends outside of the window $T_w$.

Figure 12A:
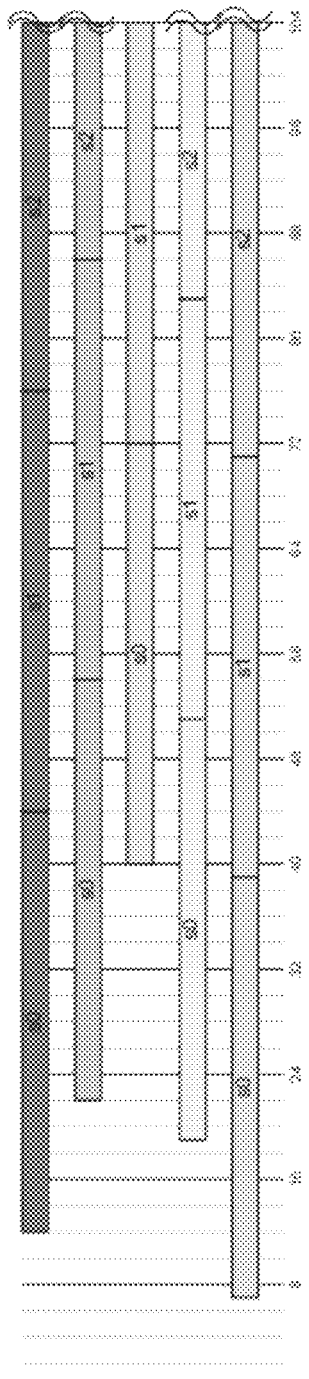
FIG. 12A illustrates a group of five user signals overlapping with timing offsets in an input stream.
Figure 12B:
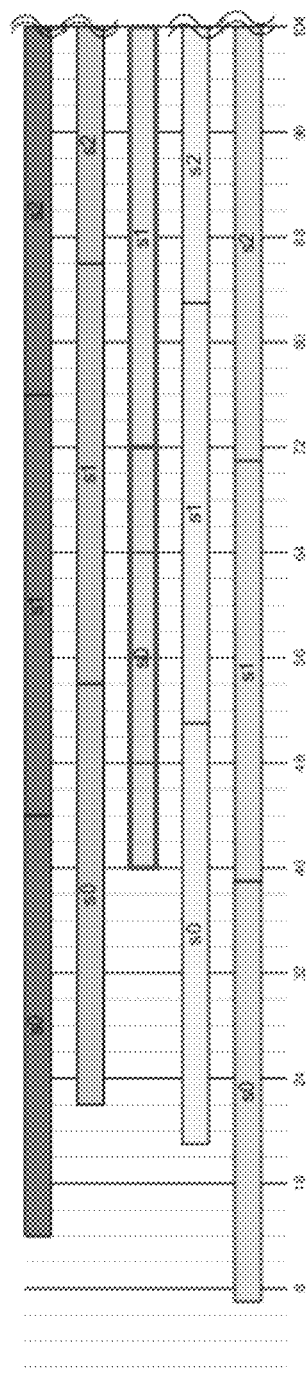
FIG. 12B illustrates a second step in determining an appropriate sampling window for the input stream of FIG. 12A according to an embodiment of the present invention.
Figure 12C:
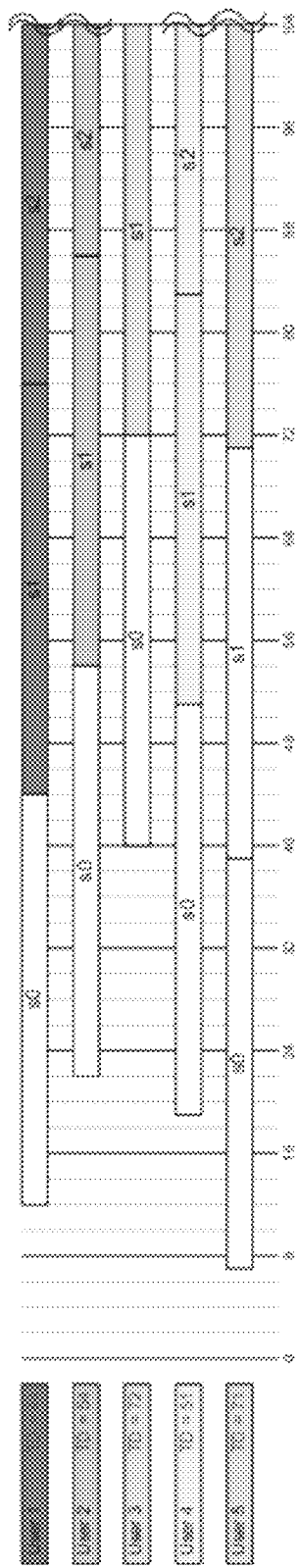
FIG. 12C illustrates a third step in determining an appropriate sampling window for the input stream of FIG. 12A according to an embodiment of the present invention.

Embodiments of the present invention include a window selection algorithm which aligns the input data for optimal processing. The method assumes that estimates are available for the timing offsets of each information stream. The method proceeds as follows:

Sort the timing delays (TDs) in order of lowest to highest
Adjust all users' TD's so that they are greater than the maximum TD
   All adjustments are done in terms of samples per symbol (32 samples in some embodiments)
Re-sort the adjusted TDs in order of lowest to highest
Determine the best time offset to use for the window
   For each user subtract their adjusted TD from the maximum sorted adjusted TD
   Set the new maximum TD to the current adjusted TD plus one symbol worth of samples
   If the difference is less than the prior determined minimum difference MD,
     Subtract off two symbols worth of samples from the adjusted TD and save that number as the time offset
     Set this difference as the new MD for future comparisons
     For the first user use a difference of one symbol in samples (32 samples in some embodiments)
   If the difference is equal to or greater than the threshold move to the next user
Repeat previous steps until all valid users have been considered After the window has been selected, it is necessary to specify which symbol from each user is located within the window. This is expressed by assigning a so-called "training index" PN to each user, which is determined according to the following steps:

Set the PN to be the training index for each user
   Subtract the original TD from the time offset and round down to a symbol boundary
Add two symbols to the above answer to get the PN training index An example of this method is presented in FIGS. 12A through 12J for five users having various timing offsets, where each symbol includes 32 samples. FIG. 12A illustrates the signal as it is received. The first step, as shown in FIG. 12B, is to find the user with the maximum timing delay (TD), which in this example is User 3 with TD=TDmax=40 samples. The next step, as shown in FIG. 12C, is to adjust the TD for each user to be greater than 40 samples. All adjustments are done in units of one symbol, which in this case equals 32 samples. Note that User 3 is also adjusted to be less than (i.e. not equal to) TDmax.

Figure 12D:
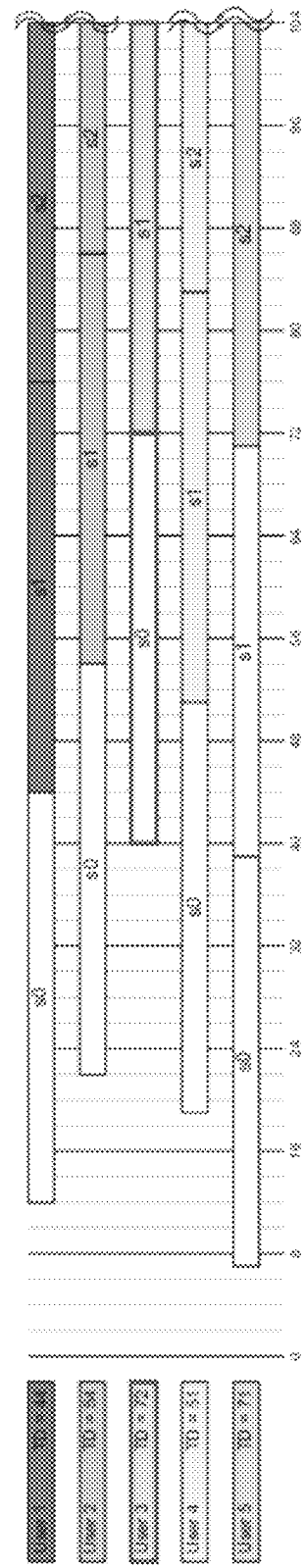
FIG. 12D illustrates a fourth step in determining an appropriate sampling window for the input stream of FIG. 12A according to an embodiment of the present invention.
Figure 12E:
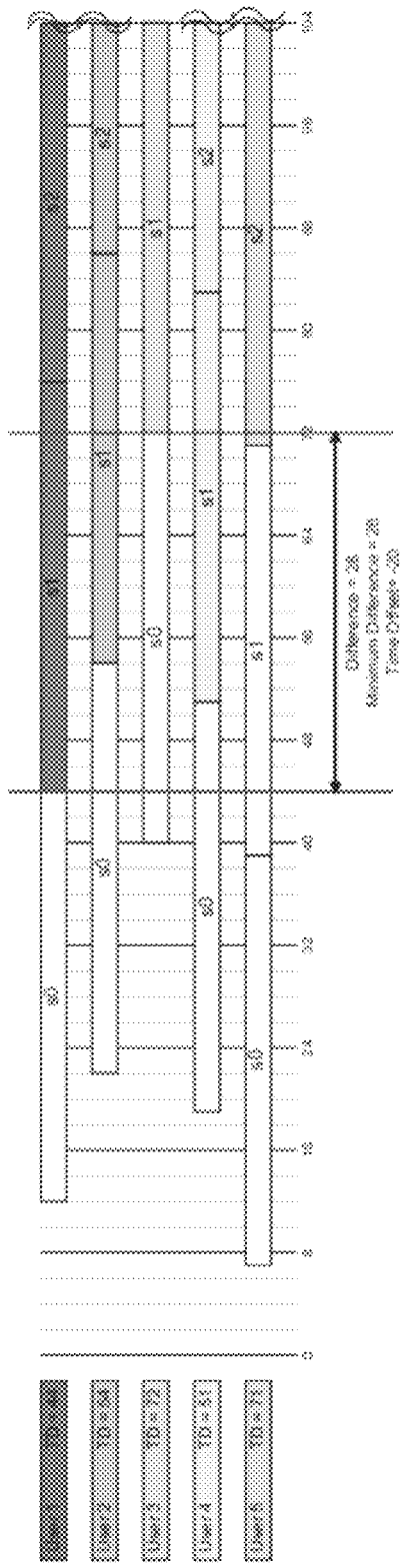
FIG. 12E illustrates a fifth step in determining an appropriate sampling window for the input stream of FIG. 12A according to an embodiment of the present invention.

As shown in FIG. 12D, the next step is to find the maximum timing delay of the adjusted user signals, which is User 3 with a delay of 72 samples. This becomes the new TDmax. As shown in FIG. 12E, the smaller adjusted timing delay (User 1 with TD=44) is subtracted from TDmax to yield a "minimum difference" or MD of 28 samples. Two symbols=64 samples are subtracted from the TD of User 3 to give a timing offset (TO) of −20, and an additional symbol delay is added to TDmax, yielding a value of 44+32=76 samples.

Figure 12F:
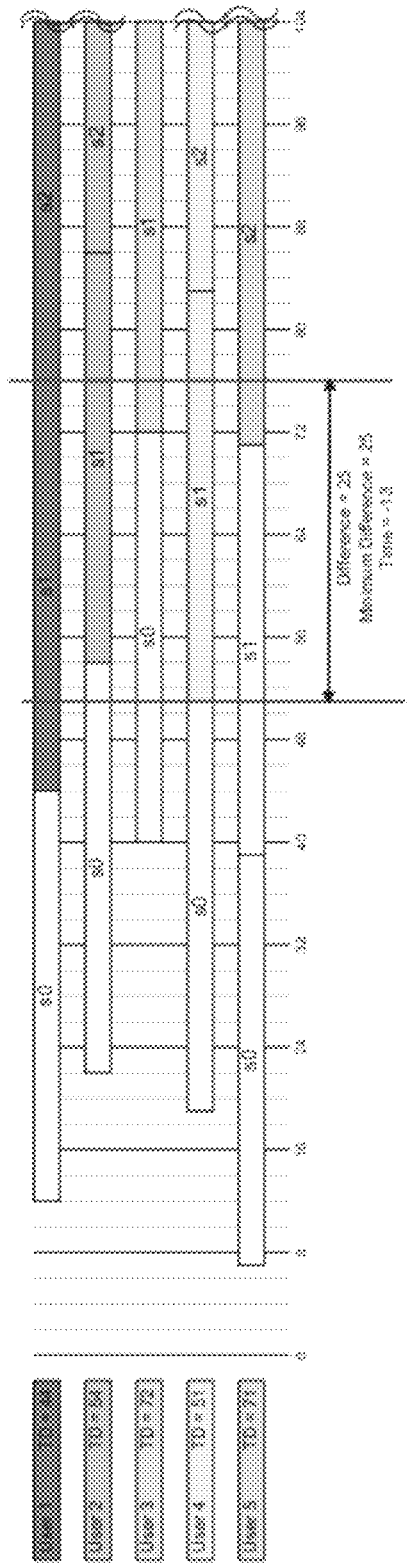
FIG. 12F illustrates a sixth step in determining an appropriate sampling window for the input stream of FIG. 12A according to an embodiment of the present invention.

In FIG. 12F, the next-biggest adjusted TD (User 4) is subtracted from TDmax, yielding a difference of 25 (76-51). Since this is less than the previous MD, MD is re-set to the new value of 25. Two symbols are subtracted from the TD for User 4 to give a TO of −13, and TDmax is reset to the timing delay of User 4 plus one symbol, which is 51+32=83 samples.

Figure 12G:
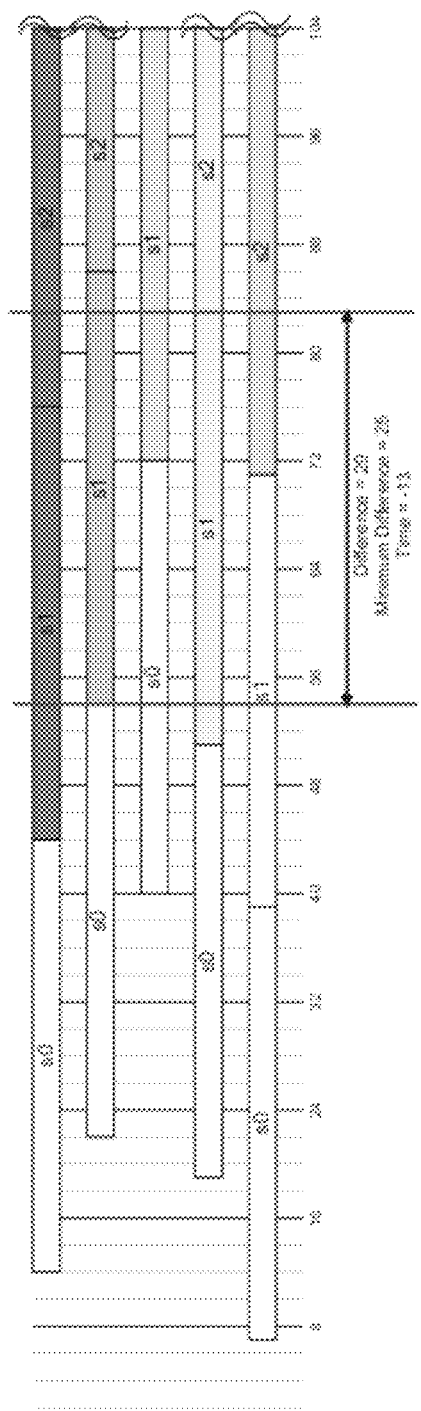
FIG. 12G illustrates a seventh step in determining an appropriate sampling window for the input stream of FIG. 12A according to an embodiment of the present invention.
Figure 12H:
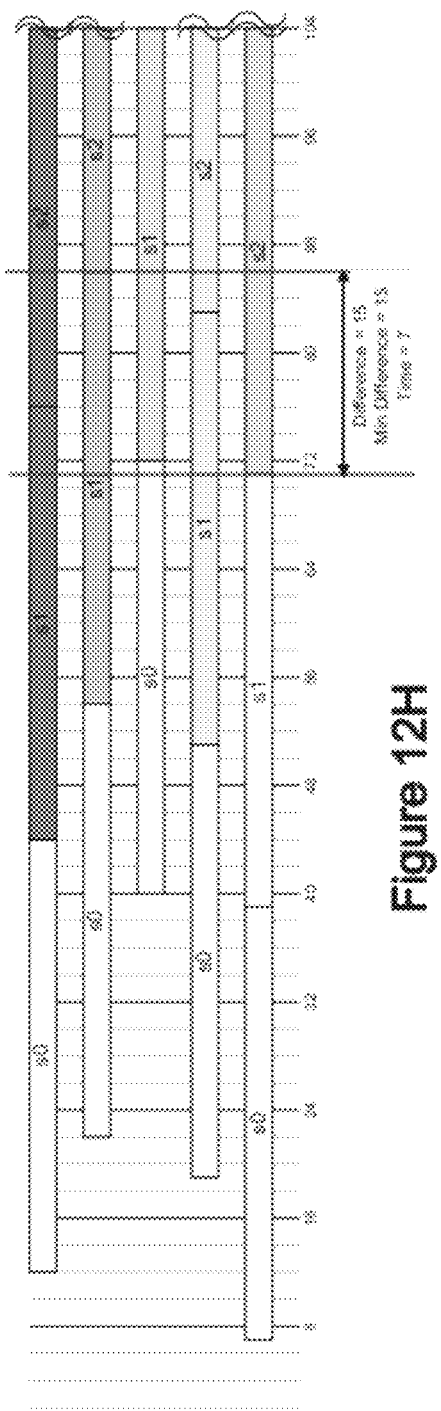
FIG. 12H illustrates an eighth step in determining an appropriate sampling window for the input stream of FIG. 12A according to an embodiment of the present invention.
Figure 12I:
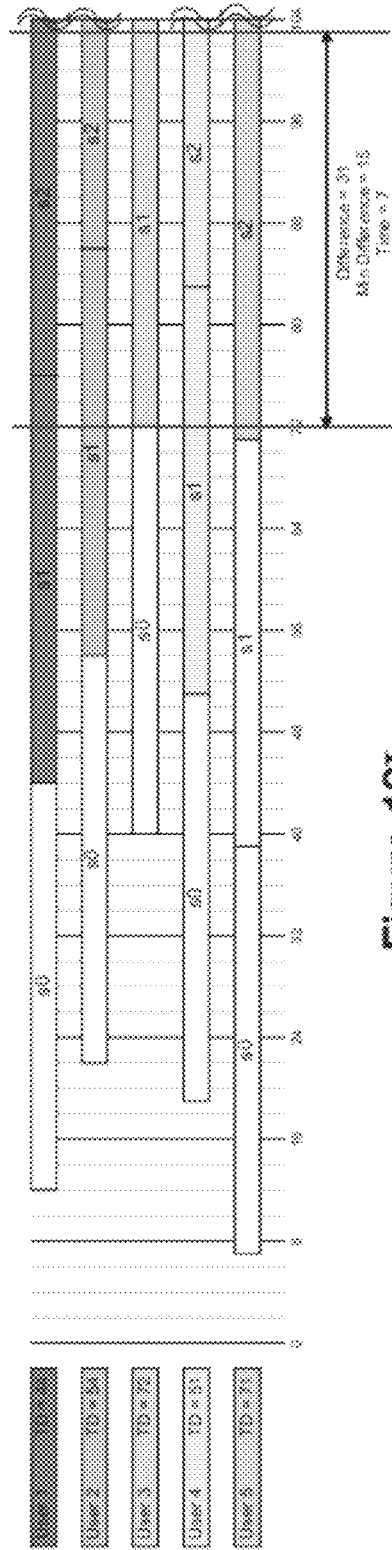
FIG. 12I illustrates a ninth step in determining an appropriate sampling window for the input stream of FIG. 12A according to an embodiment of the present invention.

The process illustrated in FIG. 12F is then repeated for each of the remaining users. In FIG. 12G, the next biggest adjusted TD is User 2. Subtracting the timing delay of User 2 from TDmax yields an offset of 29 (83−54). Since this is more than the previously recorded MD, MD is not reset, and TO remains at −13. However, TDmax is still reset to the timing delay of User 2 plus one symbol, which yields TDmax=54+32=86. In FIG. 12H, the timing delay of User 5 is subtracted from TDmax, yielding a difference of 15. Since this is smaller than the previously recorded value of MD, MD is reset to 15 and TO is set to the TD of User 5 minus 64=7. TDmax is reset to the TD of User 5 plus 32, which is 103.

The next largest adjusted TD is for User 3. As shown in FIG. 1, the offset is larger than MD, so MD is not reset. At this point, all of the users have been considered, and the resulting timing offset is 7. This represents the starting point of the sampling window, which then extends from 7 according to the desired window width, which is typically N, where N is the number of taps in the QR-RLS filter.

Figure 12J:
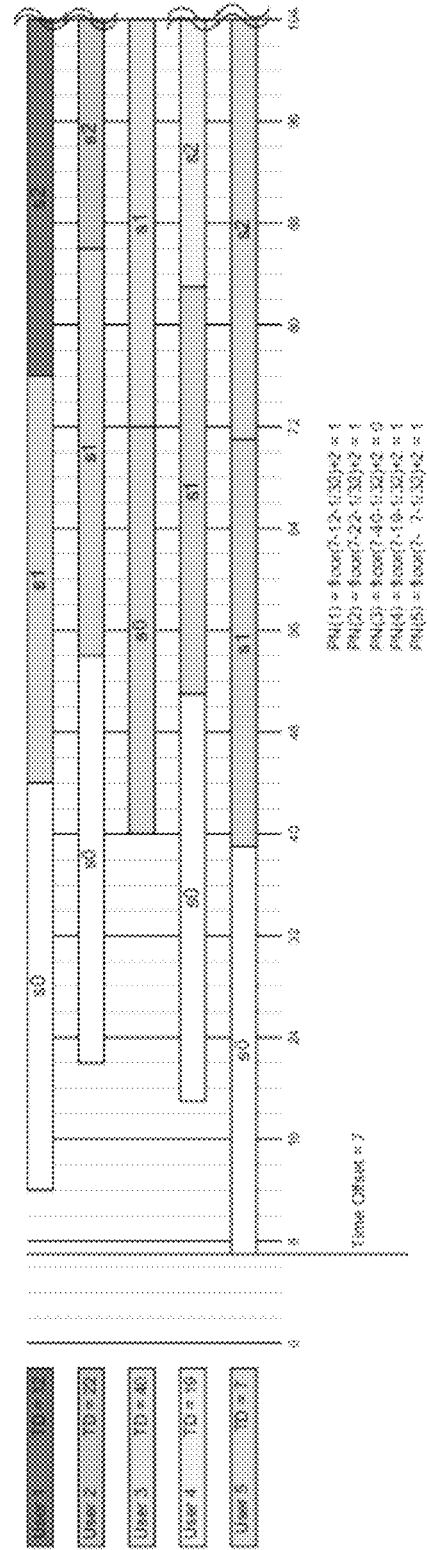
FIG. 12J illustrates a method of determining the offset indexes for the input streams of FIG. 12A according to an embodiment of the present invention.

In FIG. 12J, the indexes PN(i) are calculated for each of the users according to the formula:

$$PN(i) = \text{floor}((\text{time-offset} - TD(i) - 1)/32) + 2 \qquad (3)$$

where in the example of FIGS. 12A through 12J 32 is the number of samples per symbol, and the time-offset is determined to be 7, as discussed above. For FIGS. 12A through 12J, the index for user 3 is equal to zero, and the indices for all of the other users are equal to 1.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A genetic method for identifying groups of asynchronous spreading codes having minimal mutual correlations, the method comprising: randomly selecting a population of candidate Code Division Multiple Access (CDMA) asynchronous spreading codes; grouping the candidate CDMA asynchronous spreading codes into competition groups; within each competition group, ranking the CDMA asynchronous spreading codes according to their fitness relative to the other members of the competition group; for each competition group, eliminating at least the candidate CDMA asynchronous spreading code having the lowest fitness; replacing the eliminated candidate CDMA asynchronous spreading codes with randomly selected replacement CDMA asynchronous spreading codes; and repeating the steps of grouping, ranking, eliminating, and replacing until a termination criterion has been met; wherein at least one of the preceding steps is performed by a processor.

2. The method of claim 1, wherein ranking the CDMA asynchronous spreading codes within each competition group includes: for each candidate CDMA asynchronous spreading code in the competition group, calculating its correlations with all other members of the competition group for each I-chip relative time shift therebetween; calculating a Frobenious norm of each calculated correlation; determining a maximum Frobenious norm for each candidate CDMA asynchronous spreading code in the competition group; and ranking each candidate CDMA asynchronous spreading code in the competition group according to its maximum Frobenious norm, the candidate with the highest maximum Frobenious norm having the lowest fitness of the competition group.

3. A method for choosing asynchronous spreading codes having minimal mutual correlations, the method comprising: grouping respective candidate asynchronous spreading codes of a population of candidate asynchronous spreading codes into groups; for each candidate asynchronous spreading code in the group, calculating its correlations with all other members of the group for each I-chip relative time shift therebetween; for each group, calculating a Frobenious norm on a set of calculated correlations of that group; and choosing a group based on comparing the calculated Frobenious norms; wherein at least one of the preceding steps is performed by a processor.

4. The method of claim 3, wherein each correlation in the set of calculated correlations is the maximum correlation across all shifts between two correlated candidate asynchronous spreading codes.

5. The method of claim 3, wherein choosing a group based on comparing the calculated Frobenious norms includes choosing the group with the lowest Frobenious norm.

* * * * *